United States Patent [19]

Holmes et al.

[11] Patent Number: 5,362,812

[45] Date of Patent: Nov. 8, 1994

[54] REACTIVE POLYMERIC DYES

[75] Inventors: Gary L. Holmes, Vadnais Heights; Terrance P. Smith, Woodbury; Mahfuza B. Ali, Mendota Heights; David W. Macomber, St. Paul, all of Minn.

[73] Assignee: Minnesota Mining and Manufacturing Company, St. Paul, Minn.

[21] Appl. No.: 52,337

[22] Filed: Apr. 23, 1993

[51] Int. Cl.$^5$ .......................................... C08F 230/04
[52] U.S. Cl. .................................. 525/274; 525/279; 525/326.6; 525/326.8; 526/241; 526/260
[58] Field of Search ..................... 525/274, 279, 326.6, 525/326.8; 526/241, 260

[56] References Cited

U.S. PATENT DOCUMENTS

| Re. 28,208 | 10/1974 | Sato et al. ........................... 96/101 |
| 2,185,343 | 1/1940 | Keyes et al. ....................... 260/240 |
| 2,748,114 | 5/1956 | Brooker et al. ................... 260/240.4 |
| 2,935,393 | 5/1960 | Luckenbaugh ...................... 71/2.6 |
| 3,160,648 | 12/1964 | O'Brochta et al. ................ 260/453 |
| 3,190,850 | 6/1919 | Burke, Jr. ............................ 260/38 |
| 3,265,767 | 8/1966 | Caldwell et al. ................... 260/883 |
| 3,364,186 | 1/1968 | Wilhelm et al. ................. 260/80.72 |
| 3,373,140 | 3/1968 | Aftergut ............................. 260/47 |
| 3,420,787 | 1/1969 | Reymore, Jr. et al. ............. 260/2.5 |
| 3,555,071 | 1/1971 | Rao et al. ......................... 260/453 |
| 3,615,453 | 10/1971 | Jenkins et al. .................... 96/35.1 |
| 3,671,236 | 6/1972 | Beusekom .......................... 96/15 |
| 3,702,767 | 11/1972 | Ohlseblager et al. ............... 96/127 |
| 3,718,692 | 2/1973 | Rao et al. ....................... 260/562 A |
| 3,758,465 | 9/1973 | Jenkins et al. ................... 260/240.1 |
| 3,920,855 | 11/1975 | Dawson et al. .................... 426/250 |
| 3,937,851 | 2/1976 | Bellanca et al. ................... 426/540 |
| 4,101,269 | 7/1978 | Champnois ........................... 8/4 |
| 4,275,002 | 6/1981 | Gless, Jr. et al. ................. 260/144 |
| 4,279,662 | 7/1981 | Bunes ................................ 106/289 |
| 4,293,666 | 10/1981 | Maslanka et al. .................. 525/284 |
| 4,293,667 | 10/1981 | Maslanka et al. .................. 525/284 |
| 4,343,729 | 8/1982 | Maslanka et al. .................. 524/529 |
| 4,378,411 | 3/1983 | Heilmann et al. .................. 428/500 |
| 4,381,261 | 4/1983 | Bonnet ............................. 260/162 |
| 4,403,062 | 9/1983 | Maslanka et al. .................. 524/458 |
| 4,403,063 | 9/1983 | Maslanka et al. .................. 524/458 |
| 4,403,092 | 9/1983 | Davis et al. ....................... 528/290 |
| 4,614,521 | 9/1986 | Niwa et al. .......................... 8/471 |
| 4,619,990 | 10/1986 | Elmasry ............................ 534/573 |

(List continued on next page.)

FOREIGN PATENT DOCUMENTS

| 0392735 | 10/1990 | European Pat. Off. . |
| 59-45195 | 3/1984 | Japan .................... B41M 5/26 |
| 63-317558 | 12/1988 | Japan .................... C09B 69/10 |
| 1036700 | 7/1966 | United Kingdom ...... C06F 3/84 |
| 1223441 | 2/1971 | United Kingdom ...... C08F 12/00 |

OTHER PUBLICATIONS

R W Dyson, Ed., "Specialty Polymers" Blackie & Sons Ltd, Glasgow (1987) pp. 117–118.

R. Price, "The Chemistry of Synthetic Dyes", vol. III, Chapter VII, Academic Press 1970.

E. Marechal, "Polymeric Dyes–Synthesis, Properties and Uses", Progress in Organic Coatings, 10 (1982) 251–287.

Asquith et al., "Explanatory Paper Self–coloured Polymers based on Anthraquinone Residues", JSDC Apr. 1977, pp. 114–125.

Primary Examiner—Mark Nagumo
Attorney, Agent, or Firm—Gary L. Griswold; Walter N. Kirn; Carolyn V. Peters

[57] ABSTRACT

Reactive polymeric dyes are provided comprising a chromophoric moiety derived from at least one free radically polymerizable dye and an azlactone moiety derived from 2-alkenylazlactone such that the free radically polymerizable dye is incorporated into the backbone of the polymer. Alternatively, 2-alkenylazlactone is polymerized and then derivatized with a nucleophilic dye or dyes, such that the chromophoric portion of the dye is pendent to the polymer backbone. Both types of reactive polymeric dyes may also contain additional polymerized monomeric units. The reactive polymeric dyes of the present invention can be used in a photoresist system and in particular in a color proofing construction.

37 Claims, No Drawings

U.S. PATENT DOCUMENTS

| | | | |
|---|---|---|---|
| 4,640,690 | 2/1987 | Baumgartner et al. | 8/506 |
| 4,650,743 | 3/1987 | Galloway | 430/278 |
| 4,732,570 | 3/1988 | Baumgartner et al. | 8/506 |
| 4,737,560 | 4/1988 | Heilmann et al. | 526/304 |
| 4,763,371 | 8/1988 | Parton | 8/647 |
| 4,778,742 | 10/1988 | Ong et al. | 430/106 |
| 4,831,109 | 5/1989 | Mitra et al. | 528/125 |
| 4,871,824 | 10/1989 | Heilmann et al. | 526/304 |
| 4,909,806 | 3/1990 | Garbe | 8/647 |
| 4,952,640 | 8/1990 | Francis et al. | 525/328.2 |
| 4,965,131 | 10/1990 | Nair et al. | 428/407 |
| 4,981,933 | 1/1991 | Fazio et al. | 526/268 |
| 4,997,897 | 3/1991 | Melpolder | 526/284 |
| 5,149,806 | 9/1992 | Moren et al. | 544/72 |
| 5,157,108 | 10/1992 | Krepski et al. | 528/503 |
| 5,166,326 | 11/1992 | Smith et al. | 534/701 |
| 5,194,623 | 3/1993 | Krepski et al. | 548/261 |
| 5,235,015 | 8/1993 | Ali et al. | 526/304 |

REACTIVE POLYMERIC DYES

TECHNICAL FIELD

This invention relates to polymeric dyes, the preparation and use thereof, and more particularly to reactive polymeric dyes useful in photoresist constructions and more particularly in aqueous developable color proofing constructions, as well as other color imaging constructions.

BACKGROUND OF THE INVENTION

In the graphics arts, it is often desirable to produce a four or more color proof from image data to assist a printer in correcting a set of color prints prior to using the image data to produce color plates and also to reproduce the color quality that will be obtained during the printing process. The proof must be a consistent duplication of the half tone image from a priming process, and should neither gain nor lose color in comparison to the printed image. Visual examination of a color proof should show the following characteristics:
1. defects on the negatives,
2. best color rendition to be expected from press printing of the material,
3. correct gradation of all colors and whether grays are neutral, and
4. need, if any, for subduing one of the colors and/or giving directions for altering the film negatives before making the printing plates.

Color proofing for multi-colored printing without the use of pre-press color proofs are made by using a printing press or a proof press taking all the steps necessary for actual multicolor printing. Such a conventional method of color proofing is costly and time consuming.

Photographic processes are known that use photopolymers. There are various types of photographic color proofing methods, for example, the surprint type (laminated single sheet) and the overlay type.

Presently, aqueous developable color proofing constructions utilize resin-dispersed pigments. Such resins have to provide a good pigment dispersion but must also be compatible with photooligomers or photopolymers used in the color proofing construction. Unfortunately, dispersed pigments are prone to migration into adjacent layers of the proofing construction, thus contributing to colorant bleeding.

In the overlay type of color proofing method, an independent transparent plastic support is used for producing a print of each color separation film by applying a photosensitive layer of the corresponding color. A plurality of such supports carrying prints of corresponding colors are then superimposed upon each other on a white sheet to produce a color proof. The primary advantage of overlay type of color proofing is that it is quick and can serve as an overlay proof by combining at least three or four colors in register.

In the surprint (adhesively laminated single sheet construction) type of color proofing method, a color proof is prepared by successively producing prints of different colors from different color separation films, respectively, by applying a photosensitive coating of photopolymers of corresponding color on the opaque support in succession. Alternatively, each color separation can be prepared by applying a photosensitive coating of photopolymers of the corresponding color to a strippable support base film and then adhesively laminating the separate color prints together, in register, to prepare a full color proof. Some examples are described in U.S. Pat. Nos. 3,671,236 and 3,136,637. An advantage of this surprint type of color proof is that the color saturation is not influenced by the plastic support. This method more closely resembles the actual printing process and eliminates the color distortion inherent in the overlay system.

An another example of a color-proofing system is one described in U.S. Pat. No. 3,671,236 wherein a light-sensitive continuous color layer is releasably attached to a carrier. Overlaying the color layer is a water-insoluble transparent colorless barrier layer, to the opposite surface of which can be applied a pressure-sensitive adhesive. Upon lamination of the sheet to a substrate, and removal of the carrier, the color layer is formed onto an image, photomechanically, by removal thereof in the non-image areas.

In addition to overlay or surprint types of color proofing, other processes for producing copies of an image embodying a photopolymerization and thermal transfer techniques are known. Some examples are described in U.S. Pat. Nos. 3,060,023, 3,060,024, 3,060,025, 3,481,736, and 3,607,264. Generally, in these processes, a photopolymerizable layer coated on a suitable support is exposed, imagewise to a process transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferable, unexposed image areas of the composition transfer to the image receptive element. If the element is not precolored, the tacky unexposed image may now be selectively colored with a desired toner. The colored matter adheres, preferentially, to the clear unpolymerized material. Since lamination, exposure and development are carried out for the respective colors, in sequence, these processes are generally time consuming.

Typically, the proofing constructions add an oxygen barrier between the support base film and the colorant layer. However, such barriers can fracture along the edges of the transparent sheet, or along the peel front, thus permitting entry of oxygen. The oxygen prohibits photopolymerization. Furthermore, several barriers are susceptible to water damage and render the construction ineffective and non-functional.

U.S. Pat. No. 4,239,868 teaches the preparation and use of structurally colored cross-linkable compositions. These materials are formed by the copolymerization of free-radically polymerizable dyes and acrylates with pendent hydroxy functionality. The hydroxyl groups are subsequently derivatized with an ethylene-containing group, to render the colored polymer cross-linkable. The polymers have relatively low molecular weights, that is, in the range of 1,000–12,800 Daltons.

Examples of other polymeric dyes developed had molecular weight in the range of 4500–5000 and can contained up to 15% dye. For example, an ionomeric macromolecular dye based on polyvinylamine and used in foodstuffs are described in U.S. Pat. Nos. 3,920,855, 3,937,851, 4,275,002 and 4,279,662.

SUMMARY OF THE INVENTION

Briefly, in one aspect of the present invention reactive macromolecular dyes (also referred to as reactive polymeric dyes) are provided comprising a chromophoric moiety derived from at least one free radically polymerizable dye and an azlactone moiety derived from 2-alkenylazlactone such that the free radically polymerizable dye is incorporated into the backbone of the polymer. Alternatively, 2-alkenylazlactone is polymerized and then derivatized with a nucleophilic dye or dyes, such that the chromophoric portion of the dye is pendent to the polymer backbone. Both types of reactive polymeric dyes may also contain additional polymerized monomeric units.

Advantageously, these reactive polymeric dyes may contain other functional moieties derived by incorporating various nucleophiles into the polymer. As used in this application "reactive" means the properties of the polymeric dye may be modified or altered by a nucleophilic reaction to provide additional functionality, such as solubilization, cross-linking, or compatibility. Alternatively, the polymeric dye may be modified by using other polymerizable monomeric units. The reactive polymeric dyes have a number average molecular weight of 5,000 to 5,000,000 Daltons. These reactive polymeric dyes are excellent materials for use in an aqueous developable color proofing construction, as well as being particularly useful in a dry peel apart construction. The reactive polymeric dyes display excellent shelf stability and oxygen insensitivity.

The advantages of the reactive polymeric dyes of the present invention in photoresist systems and in particular in aqueous developable color proofing systems include (1) no need to disperse pigments in resin binder systems, (2) no diffusion of pigment into accompanying layers of the construction, (3) molecular high transparency, (4) excellent shelf stability, (5) polymeric mechanical properties, and (6) improved handling features.

In another aspect of the present invention, a proofing film construction is provided comprising:
(a) a flexible support base film; and
(b) a colorant layer comprising a reactive polymeric dye and adjuvants.

In yet another aspect of the present invention, a transparent adhesive layer may be added to the construction, with a barrier layer between the colorant layer and the adhesive layer.

As used in this application:

"absorptivity coefficient" can be used interchangeably with extinction coefficient;

"ancillary ligand" refers to an essentially colorless organic group, which is bound to the metal center by the donation of a lone pair of electrons or in the case of multidentate groups by the donation of two or more pairs of electrons in order to satisfy the coordination requirement; these groups are considered auxochromic groups for metal-containing dyes; ancillary ligands can be neutral or negatively charged, further ancillary ligands can be monodentate or polydentate (e.g. bidentate) and may include: water, ammonia, halide (−1) (e.g. fluoride (−1), chloride (−1), etc.), thiocyanide (−1), cyanide (−1), azide (−1), carbon monoxide, alkyl or aryl isocyanides, alkyl and aryl nitriles (e.g. acetonitrile, benzonitrile), alkyl and aryl phosphines (e.g. trimethylphosphine, triphenylphosphine, diethylphenylphosphine, alkyl and aryl amines, diamines (e.g., ethylenediamine, 1,2-benzenediamine), polyamines, alkylsulfides, arylsulfides, heteroarenes (e.g., pyridine, imidazole, quinoline, 2,2′-bipyridine, 1,10-phenanthrolene, etc.), nitrate (−1 ), sulfate (−2), oxalate (−2), alkyldiketonates (−1) (e.g., acetylacetonate (−1)), 8-hydroxyquinolate (−1);

"dye" refers to any molecule absorbing electromagnetic radiation between 350 nm and 1200 nm, such that the molar absorptivity coefficient of the material exceeds 1000 liters/mole.cm somewhere in the aforementioned region;

"dye nucleus" refers to the principle chromophore in a dye molecule;

"dye moiety" refers to an organic radical derived from abstracting an atom such as hydrogen or chlorine from either the dye nucleus or an auxochromic group;

"auxochromic group" refers to a group that when attached to a chromophoric moiety substantially shifts the principal wavelength of absorption in the dye molecule;

"auxochromic moiety" refers to an organic radical derived from abstracting an atom from an auxochromic group;

"chromophore" refers to the portion of a dye molecule that is substantially responsible for the absorption of electromagnetic radiation in the dye molecule; dyes are sometimes classified on the basis of their principle chromophore; for metallized dyes (i.e., metal-azo dyes, metal-azomethine dyes, metal formazan dyes, or phthalocyanine dyes), the term "chromophore" refers to the organic-derived ligand containing the principle light absorbing component (e.g., 2,2′-azobis [phenolato ](−2 ), [1-[(2-hyroxyphenyl)azo ]-2-naphthalenolato ](−2), the double deprotonated dianion of [2-[N-(2-hydroxy-3,5-dinitrophenyl)formimidoyl]-3,5-dimethoxy] phenol, deprotonated phthalocyanine dianion) and the metal;

"chromophoric moiety" refers to a radical generated by abstracting an atom from a dye nucleus; and "metal-containing dye fragment" refers to a metallized dye chromophore, as defined above, which may also possess one or more ancillary ligands, with the proviso that at least one vacant, available coordination site also be present on the metal.

DESCRIPTION OF THE PREFERRED EMBODIMENT(S)

Macromolecular colorants are an alternative class of coloring material, possessing many of the best properties of the conventional colorants. Polymeric colorants were extensively developed in the early 1970's, however, this versatile class of colorants has not been extensively used for imaging applications. For the most part, the polymeric colorants that have been used in imaging applications have been simple copolymers and the principle advantage of these materials has been to reduce the mobility of the colorant. The availability of new functionalizable comonomers has allowed for the development of more versatile macromolecular colorants which can be used in imaging media.

The reactive polymeric dyes of the present invention can be used in a photoresist system and in particular in a color proofing construction. Photoresists are essentially systems where a layer of material that is sensitive to light is coated onto a surface and then exposed to actinic radiation generally in the visible and near UV regions of the electromagnetic spectrum through a master-image, mask or pattern. This causes a change of some of the properties of the layer such as solubility, softening point or Tg, etc. This change in the layer material properties allows for parts of the layer to be removed leaving an imagewise stencil on the support.

Some examples of photoresist systems include: (1) crosslinking of a light sensitive colloid or synthetic polymer by the addition of a photosensitizer that causes decomposition to form an active species that insolubilizes the surrounding binder, for example dichromate/gelatin or azide/rubber; (2) polymers containing photosensitive groups built in situ of the structures, forming crosslinks between their molecules on exposure to actinic radiation, to significantly lower their solubility or softening point; and (3) photopolymerization providing a means of insolubilization or increase of softening point, whereby monomeric compounds are made to polymerize via actinic radiation with or without a photosensitizer/initiator present.

A primary application of such a color proofing construction is an aqueous developable color proofing system. This color proofing construction can be used in an overlay construction, a single sheet construction, or for thermal transferographics, as well as in dry peel apart constructions.

The color proofing construction of the present invention comprises a flexible support base film, and coated thereon, a colorant layer comprising the reactive polymeric dyes of the present invention, wherein the colorant layer is an aqueous developable imaging layer or thermally transferable layer.

Contemplated to be within scope of the present invention are various color proofing construction configurations. Amongst the various configurations are the following non-limiting examples:

(1) in sequential order, (a) a flexible support base film, and (b) a colorant layer;

(2) in sequential order, (a) a flexible support base film, (b) a colorant layer coated thereon, and (c) an oxygen barrier layer coated on the surface of the colorant layer;

(3) in sequential order, (a) a flexible support base film, (b) a colorant layer, and (c) an adhesive layer;

(4) in sequential order, (a) a flexible support base film, (b) an oxygen barrier layer, and (c) a colorant layer, wherein the base film has a release surface;

(5) in sequential order, (a) a flexible support base film, (b) a colorant layer coated thereon, (c) a barrier layer, and (d) an adhesive layer, wherein the barrier layer protects the colorant layer from the adhesive layer and vice versa;

(6) in sequential order, (a) a flexible support base film, (b) an oxygen barrier, (c) an colorant layer, and (d) an adhesive layer; and (7) in sequential order, (a) a flexible support base film, (b) an oxygen barrier layer, (c) a colorant layer, (d) a barrier layer to protect the colorant layer from an adhesive layer and (e) the adhesive layer, wherein the base film has a release surface.

The reactive polymeric dyes of the present invention comprise a dye moiety derived from at least one free radically polymerizable dye and an azlactone moiety derived from 2-alkenylazlactone such that the free radically polymerizable dye is incorporated into the backbone of the polymer. Alternatively, 2-alkenylazlactone is polymerized and then derivatized with a nucleophilic dye or dyes, such that the chromophoric portion of the dye is pendent to the polymer backbone. Both types of reactive polymeric dyes may also contain additional polymerized monomeric units. Furthermore, these reactive polymeric dyes may contain other functional moieties derived by incorporating various nucleophiles into the polymer. The reactive polymeric dyes may be prepared according to the following flow chart, following either Path 1 or Path 2:

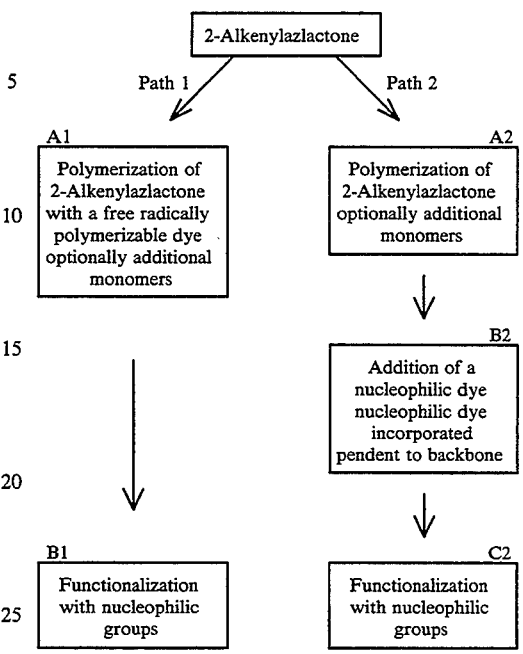

Although the flow chart indicates the reactive polymeric dyes can either be a copolymer (A1) or a derivatized azlactone homopolymer (B2) it is within the scope of the present invention to include optional additional monomers in the polymerizable compositions. For example, following Path 2, the 2-alkenylazlactone derivatized polymer (the polymer produced at A2), need only have as little as 1 mole % of a 2-alkenylazlactone-derived monomeric unit. Any art known monomers may be added to the polymerizable compositions (A1 and A2 precursor compositions), provided the monomers do not nucleophilically react with the 2-alkenylazlactone. Preferably, the A2 polymer is a homopolymer. Likewise, the A1 polymer need only contain as little as 1 mole % of 2-alkenylazlactone. For the reactive polymeric dyes of either A1 or B2 type, the polymerizable dye or nucleophilic dye is typically present in the range of 0.5 to 99 mole % of 2-alkenylazlactone.

Advantageously, the reactive polymeric dye of type A1, described by Formula I, are color stable polymeric dyes and could be blended with other art known polymers, as well as being color stable intermediates.

(I)

wherein "Az" represents monomeric azlactone residue and "Dye" represents the free radically polymerizable dye residue. Preferably, the polymers are derivatized to incorporated various nucleophiles into the reactive polymeric dye, such as described in Formula II.

Once the reactive dye polymers (A1 and B2) have been prepared, the polymers may be further functionalized with other functional moieties derived by incorporating various nucleophiles into the polymer. While it is preferable that all the azlactone moieties are functionalized, it is within the scope of the present invention that as much as 99.9% of the azlactone moieties could remain unreacted. Although, it is possible to functionalize 100% the azlactone moieties, such a polymeric dye is not reactive within the scope of the present invention but is useful in combination with the reactive polymeric dyes of the present invention A non-limiting list of various nucleophiles contemplated are illustrated and discussed below.

The reactive polymeric dyes may be prepared using 2-alkenylazlactone as a polymerizable monomer. 2-Alkenylazlactones are well-known and their synthesis, physical and chemical properties, homo- and copolymerization behavior, and preparations and applications are discussed in a recent review by Rasmussen et al. *Encyclopedia of polymer Science and Engineering,* "Polyazlactones," 2nd ed.; 1988; Vol. 11, pp 558–571. Useful 2-alkenylazlactones for the present invention include 2-vinyl-4,4-dimethyl-2-oxazolin-5-one, 2-isopropenyl-4,4-dimethyl-2-oxazolin-5-one, 2-vinyl-4-ethyl-4-methyl-2-oxazolin-5-one, 2-vinyl-4,4-diethyl-2-oxazolin-5-one, 2-vinyl-4-methyl-4-phenyl-2-oxazolin-5-one, 2-isopropenyl-4,4-tetramethylene-2-oxazolin-5-one, 2-vinyl-4,4-pentamethylene-2-oxazolin-5-one, and 2-vinyl-4,4-dimethyl-2-oxazolin-6-one. The preferred 2-alkenylazlactone monomer is 2-vinyl-4,4-dimethyl-2-oxazolin-5-one.

Polymerization of the azlactone monomers with themselves or together with free radically polymerizable dyes may be accomplished either thermally (for example, through the decomposition of acyl peroxides, dialkyl percarbonates, azoalkanes, etc.) or azo compounds, such as 2,2'-azobis(2-methylpropionitrile) or photochemically (such as photolysis of bisimidazoles, benzoin ethers, aromatic ketones, or halomethyl-s-triazines) means well known in the art.

The polymerized 2-alkenylazlactone can then be nucleophilically substituted to provide polymeric dyes with further functionality, which may impart reactivity. The azlactone residual component can be easily functionalized with a variety of nucleophiles using either acid or base catalysts. The number average molecular weight of the resulting polymer, as determined by light scattering techniques, is in the range of 5,000 to 5,000,000 Daltons.

Dye monomers useful to form the A1 polymers should contain one ethylenically unsaturated, polymerizable group, selected from vinyl, acryl, methacryl, acrylamide, methacrylamide, or allyl. Generally, useful dyes monomers are any molecules absorbing electromagnetic radiation between 350 nm and 1200 nm such that the molar absorptivity coefficient, also referred to as the extinction coefficient, of the material exceeds 1000 liters/mole-cm somewhere in the aforementioned region. Typically, dyes are classified according to the chromophoric moiety of the dye. Nonlimiting examples of such principle moieties are anthraquinone, azo, azomethine, aminostyryl, phthalocyanine, indoaniline, formazan, metal-azo, metal-azomethine and metal-formazan. For metallized dyes, the principle moiety refers to both the metal center and the organic chromophore-containing ligand. Other essentially colorless organic groups ligated to the metal center of a metallized dye are referred to as "ancillary ligands." Other useful principle moleties can be selected from the classes described in D. W. Bannister, A. D. Olin, H. A. Stinge, "Dyes and Dye Intermediates," Kirk-Othmer Encyclopedia of Chemical Technology, 3rd ed., 159–212 (1979).

The dye monomers may also contain an auxochromic group, which when attached to the chromophore substantially shifts the principal wavelength of absorption in the dye molecule. Typically auxochromic groups include, $NH_2$, NHR, $NP_2$, OH, OR, SH, SR, NHCOR, $NHSO_2R$, where R is any alkyl or aryl group. When the dye is a metal-containing dye, the auxochromic group can also include ancillary ligands. These organic groups are generally referred to as ligands and include, for example pyridine, water, ammonia, and amines. Other examples of ligands are described in F. A. Cotton, G. Wilkinson, Advanced Inorganic Chemistry, 4th ed., John Wiley & Sons, New York, 107–194 (1980). Preferred auxochromic groups for metallized dyes are nitrogen-containing heterocyclic, for example, pyridine and imidazole.

Where the term "group" is used in describing substituents, substitution is anticipated that does not interfere with the function of the compound being substituted. For example, the term "alkyl group" includes ether groups (e.g., $CH_3CH_2CH_2OCH_2$ ), haloalkyls, nitroalkyls, carboxyalkyls, hydroxyalkyls, sulfoalkyls, etc. wherein the "term" alkyl includes hydrocarbons of 1 to 20 carbon atoms. Substituents that react with active ingredients, such as strong reducing or oxidizing substituents, are excluded as not being sensitometrically inert or harmless.

A preferred class of dye monomers can be prepared from dyes containing hydroxy or amino groups, for example those prepared by the reaction of acryloylchloride or alkacryloylchloride shown in the following equation:

wherein A is a dye moiety derived from the following dye classes: anthraquinone, azo, aminostryl, phthalocyanine, indoaniline; X is either an oxygen atom or a nitrogen atom; and R is either a hydrogen atom or an alkyl group having 1–18 carbon atoms. Representative examples of A-XH include 1-aminoanthraquinone, Disperse Red 1,1-(3-hydroxypropylamino) anthraquinone. Nonlimiting examples of acryloyl and methacryloyl containing dyes are described U.S. Pat. No. 4,614,521, section [D], "Sublimable dyes having an acryloyl or a methacryloyl group" and such description is incorporated herein by reference.

Another class of useful polymerizable dyes are metal-azo or metal-azomethine dyes in which a polymerizable heterocycle such as 4-vinylpyridine, 1-vinylimidazole are ligated to a metal center. Such dyes are described in U.S. Pat. No. 5,166,326 and such description is incorporated herein by reference.

Yet another class of polymerizable dyes are those containing a styryl moiety. These materials may be prepared, for example, by the nucleophilic aromatic substitution of a halogen-containing precursors by 4-aminostyrene Particularly useful halogen-containing precursors from the anthraquinone class include, for example, 1-chloroanthraquinone, 1-amino-2-methyl-4-bromoanthraquinone. Examples of polymerizable monomeric anthraquinone dyes may be found in R. S. Asquith, H. S. Blair, A. A. Crangle, E. Riordan "Self-Colored Polymers Based on Anthraquinones" Journal of the Society of Dyers and Colorists, Apr., 1977, pp 114–125.

Useful monofunctional nucleophilic dyes are dyes with a nucleophilic reactive group selected from amino, hydroxy, hydroxyalkyl, mercaptoalkyl or aminoalkyl groups. Particularly useful dyes are those where the nucleophilic reactive group is either a hydroxy group or an amino group that is pendent to a dye nucleus and not directly bound to the dye nucleus. When the nucleophilic reactive group is an amino group, it is preferred the amine be a primary amine. Preferably the nucleophilic reactive group is attached to the dye nucleus via an auxochromic group through a linking group. The preferred linking groups are small alkyl chains, for example, methylene, ethylene, or propylene. Nonlimiting examples of useful nucleophilic dyes are described in U.S. Pat. No. 4,614,521, section [A], "Sublimable dyes capable of reacting with an epoxy group or isocyanate group" and such description is incorporated herein by reference.

Advantageously, the resulting polymer can be cross-linkable, non-tacky and easily processed, whereas certain commercial photooligomers are tacky and create processing difficulties. Another advantage is the relative oxygen insensitivity of the reactive polymeric dyes. Although the use of an oxygen barrier coat is not outside the scope of the present invention.

The reactive polymeric dyes are soluble in a variety of solvents including non-chlorinated solvents, such as MEK and water-based solvents, such as water, and water miscible organic solvents. This allows coating of a polymer-containing formulation for a color proofing construction from a more environmentally acceptable solvent. The polymers are compatible with a wide range of polymers useful in the graphic arts. Another advantage of using the polymer of the present invention is improved shelf stability over certain commercially available photooligomers. One of the advantages of the reactive polymeric dyes of the present invention is that the dyes take on the characteristics of the polymer, that is, the reactive polymeric dyes avoid the problems associated with low molecular weight polymeric dyes or monomeric dyes.

The reactive polymeric dyes of the present invention, which may be block or random, preferably random, and which have homo- or copolymeric backbones, are illustrated in the following block diagram:

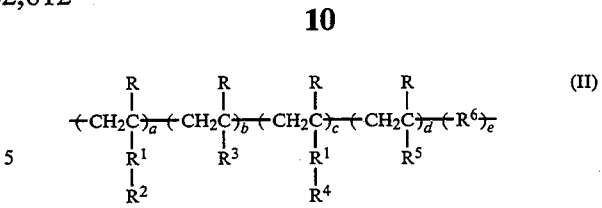

wherein
R can be hydrogen or an alkyl group containing 1 to 18 carbon atoms;
$R_1$ can be:

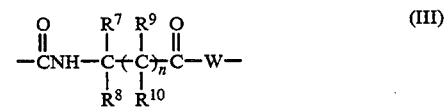

n is 0 or 1;
$R^7$, $R^8$, $R^9$, and $R^{10}$ can be independently an alkyl group having 1 to 12 carbon atoms or a cycloalkyl group having 5 to 12 carbon atoms, an aryl or aralkyl group having 6 to 12 carbon atoms or at least one of the pairs $R^7$ and $R^8$, or $R^9$ and $R^{10}$, taken together with the carbon to which it is joined forms a 5- or 6-membered carbocyclic ring, or any of $R^7$, $R^8$, $R^9$ and $R^{10}$ may be H when n is 1; preferably $R^7$ and $R^8$ are methyl and n is 0;
W can be $-NR^{14}-$, $-S-$ or $-O-$, wherein $R^{14}$ can be a hydrogen, aryl or alkyl of 1 to 12 carbon atoms; preferably W can be $-O-$ or $-NH-$;
$R^2$ can be a polymerizable, ethylenically unsaturated group selected from (a) $-R^{11}-W-T$ in which $R^{11}$ can be an alkylene group having 1 to 12 carbon atoms, an arylene group having 6 to 10 carbon atoms, an oxyalkylene group or a poly(oxyalkylene) in which the alkylene group has 2 to 6 carbon atoms and the number of oxygen atoms is a positive integer less than or equal to four, most preferably $R^{11}$ has from 1 to 4 carbon atoms; W is as previously defined, and T is an ethylenically unsaturated group selected from the group consisting of acry-

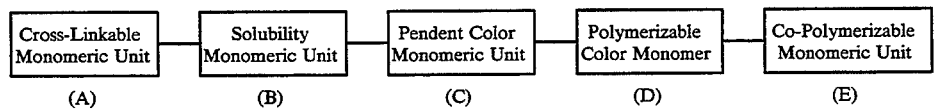

The reactive polymeric dyes of the present invention can be schematically described by combining the various blocks as identified above. The relative amounts of the monomeric units are not described at this point other than to point out, that in each configuration, the polymer contains at least one of C or D units with the proviso that when D units are present (that is, no C units are present) then at least one of A, B or a unit containing an azlactone derived moiety (E unit) is also present. For example, a useful reactive polymeric dye of the present invention would comprise A+C or D units, optionally including B and E units. Such alternative variations would include, ABC, ABD, ABCD, and ABCDE. Preferably, the reactive polymeric dyes comprise a homopolymeric backbone ABC or the copolymer ABD and optionally E units, and more preferably the polymers comprise the copolymer of ABD units.

The above block diagram can be represented by the following formula:

loyl, methacryloyl, cinnamoyl, maleoyl, fumaroyl, itaconoyl, and crotonoyl, and is preferably acryloyl or methacryloyl;

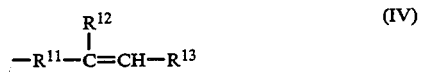

in which $R^{11}$ is as defined as in (a); $R^{12}$ and $R^{13}$ independently can be hydrogen, cyano, a carboxyl group, a $-C(=O)NH_2$ group, an alkyl group having 1 to 12 carbon atoms, or a phenyl group or naphthyl group optionally having substitution thereon which can be, for example, halogen, an alkyl or alkoxy group from 1 to 4 carbon atoms;
$R^3$ can be:

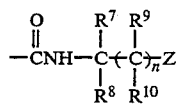

(V)

n is 0 or 1; $R^7$, $R^8$, $R^9$ and $R^{10}$ are as described above and

Z can be a carboxy, or aminocarbonyl, where the carboxy group has the formula $COOW^1$, and the aminocarbonyl group has the formula $CONR^{14}W^1$; $W^1$ can be a solubilizing cation (e.g., sodium, potassium, or quaternary ammonium) ionically bonded to a negatively charged atom such as $O^-$ or $S^-$, a hydrogen atom or $(Q^1)_x-(A)_y$ wherein $Q^1$ is a linking group, x is 1 or 2 and y is 1 to 10. $Q^1$ comprises polyvalent linking groups such as polyvalent aliphatic moieties, for example, $-CH_2-$, $-CH_2CH_2-$ and $-CH_2CH(CH_2)_2=$, polyvalent aromatic moieties, for example, phenylene, polyvalent aralkyl moieties, or polyvalent alkaryl moieties, carbonynl, sulfonyl, either alone or in combination. $Q^1$ can be linear or branched and can contain other polyvalent moieties, such as oxy, thio, $-NHSO_2-$, $-NHCO-$, and $-NH-$ interspersed between polyvalent aromatic or polyvalent aliphatic groups. Combinations of linking moieties include oxyalkylene, iminoalkylene, or iminoarylene. $Q^1$ may be multifunctional, that is, capable of bonding to more than one A group. Non-limiting examples of $Q^1$ include alkylene, arylene groups (e.g., propane-1,3-diyl, ethane-1,1,2-triyl, methylene, dodecane-1,12-diyl, phenylene), oxa-substituted alkylene groups (e.g., 2-oxapropan-1,3-diyl, 3-oxapentan-1,5-diyl), aza-substituted alkylene groups (e.g., 2-azapropan-1,3-diyl, 3-methyl-3-azapentan-1,5-diyl), and the like. Nonlimiting examples of A include carboxy group ($-COOH$), phospho group ($-PO_3H_2$), and sulfo group ($-SO_3H$) and their salts with alkali metals (e.g., sodium, lithium, potassium), mono-, di-, tri-, and tetra-substituted ammonium salts (e.g., ammonium, tetrabutyl ammonium, phenyldipropylammonium). Preferably, A is a carboxyl group, sulfo group, or phospho group or an alkali metal or tetra-substituted ammonium salts thereof.

It is possible to incorporated the quaternary ammonium salt group into the polymer by reaction with the formed polymer via a coupling reaction (such as coupling through an azlactone group with a nucleophile substituted quaternary ammonium salt), or by quaternization of a tertiary amine bound to the polymer, it is also possible to copolymerize the polymer with a quaternary ammonium salt-containing monomer. It is also possible to incorporate a quaternary ammonium salt into the polymer via deprotonation of the carboxyl group (when $W^1$ is H) with tetrabutylammonium hydroxide or tetramethylammonium hydroxide.

$R^4$ is $(Q^2)_i-(D)_j$ wherein $Q^2$ is a linking group and D is a dye moiety or a metal-containing dye fragment, i is 1 or 2 and j is 1 to 10 depending on the value of i and the multifunctional nature of $Q^2$. The atom in $Q^2$, which is covalently bonded to W is typically a carbon atom, however the bonding atom may be a sulfur atom provided W is a nitrogen and the sulfur atom is part of a sulfinyl or sulfonyl group. $Q^2$ is a polyvalent linking group, such as polyvalent aliphatic groups, for example, $-CH_2-$, $-CH_2CH_2-$ and $-CH_2CH(CH_2)_2=$, polyvalent aromatic groups, for example, phenylene, polyvalent aralkyl groups, or polyvalent alkaryl groups, carbonyl, sulfonyl, either alone or in combination. $Q^2$ can be linear or branched and can contain other polyvalent moieties, such as oxy, thio, $-NHSO_2-$, $-NHCO-$, and $-NH-$ either interspersed between polyvalent aromatic or polyvalent aliphatic groups or terminating in these groups. One particularly useful embodiment is where $Q^2$ is a small (1-6 carbon atoms) alkylene group originating on W and terminating, that is, attaching to D with, $-NH-$, $-S-$, $SO_2NH-$, $-CONH_2-$. Alternatively, $Q^2$ can comprise an auxochromic ligand moiety containing a nitrogen-containing heterocyclic moiety, such as pyridyl. $Q^2$ can also comprise a linking group as defined for $Q^1$, which terminates in an auxochromic ligand moiety, that is, pyridyl or imidazolyl. $Q^2$ may contain up to 50 atoms including carbon, nitrogen, sulfur, and non-peroxidic oxygen atoms. Combinations of linking groups include oxyalkylene, iminoalkylene, iminoarylene. $Q^2$ can be coordinated to a metal containing dye fragment or covalently bonded to a metallized dye moiety. In a particularly useful embodiment $Q^2$ is a lower alkyl group having 1 to 6 carbon atoms and terminating with an auxochromic ligand derived from a nitrogen-containing heterocyclic moiety, for example, 3-$CH_2Py$ (where Py is a pyridyl radical) when D is a metal-containing dye fragment. Nonlimiting examples of $Q^2$ include alkylene, arylene groups (e.g., propane- 1,3-diyl, methylene, dodecane- 1,12-diyl, phenylene), oxa-substituted alkylene groups (e.g., 2-oxapropan-1,3-diyl, 3-oxapentan-1,5diyl), aza-substituted alkylene groups (e.g., 2-azapropan-1,3-diyl, 3-methyl-3-azapentan-1,5-diyl), and the like. $Q^2$ can be bonded to a chromophoric moiety either directly or through an auxochromic group. Nonlimiting examples of D are radicals derived from the following dye classes: aminostyryl, anthraquinone, 1,4-diamino-2,3 dicarboximideanthraquinone, azo, hydrazone, metalazo, metal-azo methine, indoaniline, metal formazan, pthalocyanine, naphthaquinone, and nitro dyes. Preferred D groups include 1-anthraquinonyl, or 1-(4-substitutedamino)anthraquinonyl. Preferred metal-containing D groups include organic-derived radical groups from the following classes: metal-azo and metal-azo methine dyes, wherein the metal-azo or metal-azo methine ligand is at least bidentate and preferable tridentate. Preferred metals in the metal-containing D groups are chromium, cobalt, iron, nickel, palladium, platinum, and copper. When the metal center is chromium, cobalt or iron, it is preferred than an ancillary ligand such as an alkyldiketonate (for example, acetylacetonate($-1$)) or 8-hydroxyquinonlate($-1$) is also present in the metal-containing dye fragment. Other preferred classes of metal-containing dyes are metalphthalocyanine or metal formazan dyes.

$R^5$ is $(Q^2)p(D)_q$, wherein $Q^2$ and D are defined as above, p is 0 to 1 and q is 1 to 10. The bonding atom in $R^5$, that is, the atom bonded to the polymeric chain can be a carbon, nitrogen, sulfur, or oxygen atom. Preferred linking groups ($Q^2$) for $R^5$ include $-C_6H_4NH-$, $-CONH-$, $-COO-$, $-COO(CH_2)_nO-$, $-COO(CH_2)_nNH-$, where n is 1 to 10. The linking group, $Q^2$ can be attached to a metal-containing dye either by coordination to the metal of a metal-containing dye fragment or by formation of a covalent bond to a metallized dye moiety.

a, b, c, d and e independently represent a ratio of a monomeric unit to the total number of monomeric units of the functionalized portion of the azlactone moieties, such that the sum of a+b+c+d+e equals 1, alternatively, the sum of each of the percents of the single a, b, c, d, and e monomeric units of the total number of monomeric units is equal to 100%; preferably a is 0.10–0.99, b is 0.0–0.89, c is 0.0–0.99, d is 0–0.99, and e is 0–0.99, with the proviso that the sum of c+d is at least 0.01, more preferably a is 0.5–0.6. b is 0.1–0.5, c is 0.0–0.5, d is 0–0.5 and e is 0–0.2, with the proviso that the sum of c+d is at least 0.01.

When the reactive polymeric dye contains an optional additional monomer, the polymer has "e" monomeric units in range of greater than 0 and up to 0.89, more preferably in the range of greater than 0 and up 0.2. $R^6$ is a unit of the polymer derived from the free radical polymerization of free radically polymerizable monomers. Such monomers include acrylic and methacrylic acid, monofunctional acrylates, methacrylates, acrylamide, methacrylamides, acrylonitrile, methacrylonitrile, styrene, N-vinylpyrrolidone and 2-alkenylazlactone. Preferable co-monomers include dimethylaminoethyl methacrylate and acrylate, methyl methacrylate, ethyl acrylate, ethylene oxide acrylate, itaconic acid, 2-alkenylazlactone, isooctyl methacrylate, lauryl methacrylate, or salts thereof, preferably quaternary ammonium salts having 4 to 25 carbon atoms, more preferably having 10 to 25 carbon atoms. Examples of preferred quaternary ammonium cations include, but are not limited to, ethyl trimethyl ammonium, tetrabutyl ammonium, hexyltributyl ammonium, tetrahexyl ammonium, methyl tribenzyl ammonium, benzyl trimethyl ammonium, and the like.

The colorant layer formulation may contain various additional adjuvants in combination with the reactive polymeric dye. Such adjuvants include plasticizers, photoinitiators, sensitizers, electron donors, coating aids, multifunctional monomers or oligomers (crosslinking enhancers), antioxidants (e.g., ascorbic acid, hindered phenols, phenidone, etc.) in amounts sufficient to prevent premature crosslinking but insufficient to prevent crosslinking of the reactive polymeric dyes upon exposure to actinic radiation. Leveling agents, wetting agents (such as those described in U.S. Pat. Nos. 3,787,351 and 4,668,406 and such description is incorporated herein by reference), antistatic agents, waxes, ultraviolet radiation absorbers, mild oxidizing agents, and brighteners may also be used provided they do not adversely affect the practice of the invention. These adjuvants may be added in amounts effective for the known function of the materials and generally are in the range of 0.01 to 10.0 weight % of the colorant layer formulation (100% solids). Preferred total adjuvant weight % is in the range of 0–80 weight %.

The colorant layer formulation is prepared by dissolving the polymers in a suitable solvent to a concentration of about 5–70% by weight, preferably about 10 to 50% by weight. When the polymers have been prepared in a solvent, it may be necessary only to add additional solvent to reach the desired concentration. Examples of solvents that can be used include water; ketones, such as, acetone. methyl ethyl ketone; aqueous and non-aqueous alcohols, such as methanol, ethanol, n-propanol, isopropanol; ethyl acetate; benzene; toluene; trichloroethylene; monomethyl ether of ethylene glycol; propylene glycol and the like. Preferred solvents are water, aqueous alcohols and ketones. The dried coating weight of the colorant layer formulation is typically 0.3 to 5 g/m², preferably 0.5 to 4 g/m², and most preferably 0.5 to 2.5 g/m².

The colorant layer formulation also contains a photoinitiator that may be a single compound or a combination of two or more such compounds that generates radicals upon exposure to actinic radiation. Photoinitiation may be direct or sensitized. Preferred photoinitiators are sensitized or unsensitized halomethyltriazines (described, for example, in U.S. Pat. No. 3,775,113 ) and sensitized diaryliodonium salts (described, for example, in U.S. Pat. Nos. 3,729,3 13, 4,058,400, 4,058,401, and 4,921,827), hereby incorporated herein by reference. Suitable sensitizers for the preferred photoinitiators, along with effective amounts of initiator are described in the foregoing references. Effective amounts of initiator are typically in the range of 0.01 to 15 weight % of the total polymerizable composition.

Preferred diaryliodonium salts useful as photoinitiators in practice of the instant invention may be generally described by the formulas as described in U.S. Pat. No. 4,460,154, that is

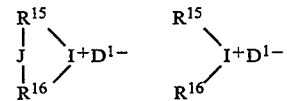

wherein $R^{15}$ and $R^{16}$ can be individually selected from aromatic groups having from 4 to 20 carbon atoms (e.g., substituted or unsubstituted phenyl, naphthyl, thienyl, and furanyl) with substantially any substitution which does not interfere with the desired reaction, J is selected from a carbon-carbon bond, oxygen, sulfur, alkylene, arylene,

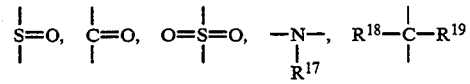

$R^{17}$ can be aryl (e.g., 6 to 20 carbon atoms) or acyl (e.g., 2 to 20 carbon atoms), $R^{18}$ and $R^{19}$ can be independently selected from hydrogen, alkyl groups of 1 to 4 carbon atoms, and alkenyl groups of 2 to 4 carbon atoms, $D^{1-}$ can be any anion, preferably a complex metal halide such as hexafluorophosphate, hexafluoroarsenate, hexafluoroantimonate, etc.

Examples of preferred diaryliodonium cations are diphenyliodonium, di(4-chlorophenyl)iodonium, 4-trifluoromethylphenylphenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, etc. Examples of other iodonium cations are disclosed in U.S. Pat. Nos. 3,729,313, 4,076,705, and 4,386,154.

Examples of substituted halomethyltriazines useful as photoinitiators are 2,4-bis(trichloromethyl)-6-methyl-s- triazine, 2,4,6-tris(trichloromethyl)-s-triazine, and styryl substituted triazines such as 2,4-bis(trichloromethyl)-6-(4'-methoxystyryl)-s-triazine, 2,4-bis(trichloromethyl)-6-(p-dimethylaminostyryl)-s-triazine, 2,4-bis(trichloromethyl)-6-(2',4'-diethoxystyryl)-s-triazine, etc. These compounds are described as noted above in U.S. Pat. Nos. 3,515,552, 3,536,489, 3,617,288, 3,640,718, 3,779,778, 4,386,154, 3,954,475, and 3,987,037.

It is also within the scope of the invention to include in the colorant layer formulation, 0 to 40 parts of a copolymerizable ethylenically unsaturated monomers or oligomers per part of the reactive polymeric dyes by weight in the polymerization compositions as crosslinking enhancers. Non-limiting examples of monomers are (meth)acrylic acid esters such as, for example, ethyl acrylate, butyl acrylate, n-octyl acrylate, allyl acrylate, cyclohexyl acrylate, N-methylcarbamoyloxyethyl acrylate, and multifunctional acrylates and methacrylates such as neopentylglycol diacrylate, 1,6-hexanediol diacrylate, pentaerythritol triacrylate and tetraacrylate, 1,3,5-tri(2-acryloyloxyethyl)isocyanurate, and the corresponding methacrylates. The preferred multifunctional oligomer is hexafunctional acrylate as described in U.S. Pat. No. 4,316,949 and such description is incorporated herein by reference.

A transparent binder may optionally be present in the colorant layer formulation. Polymeric binders may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond this minimal requirement of transparency, there is no criticality in the selection of a binder. A generally useful range is up to 30 percent by weight binder, preferably 2 to 15 percent of binder by weight.

Support base films used in the present invention support the colorant layer developable by an aqueous developing solution, thus fixing each of the layers and enabling each of the layers to exert its respective function. The support base film also provides the colorant layer with mechanical strength and dimensional stability in the temperature range between about 0° C. to about 200° C. The term "transparent" support as used herein means supports having a thickness of from about 50 micrometers to about 2 millimeters, and more preferably from about 80 micrometers to about 1.5 millimeters, which can transmit not less than about 65%, of incident light with a wavelength of from about 290 nanometers to about 700 nanometers. When the color proofing construction is used for a surprint application or a transfer lithographic application, the support base material need not be transparent, but should provide a release surface, which may either be a smooth surface, or a surface coating thereon.

Suitable support base films include resin-coated paper, aluminum sheeting, or various transparent opaque plastic sheets or films. Suitable transparent or opaque plastic sheets or films include film forming synthetic or high polymers including cellulose nitrate, cellulose acetate, cellulose acetate butyrate, cellulose acetate propionate, polystyrene, polyester, e.g., poly(ethylene terephthalate), poly(vinylidene chloride), poly(vinyl chloride), polypropylene, poly(vinyl acetate), polyisobutylene polymers and copolymers, polycarbonate, etc., and various laminated films of the above described materials. Among these, the preferred support material is a flexible poly(ethylene terephthalate) film.

The adhesive layer comprises a thermally activated adhesive that may be coated on the top surface of a barrier layer or the colorant layer. The coating thickness of this layer is generally 5 to 20 g/m². A thermally activated adhesive layer is preferred over a pressure sensitive adhesive because the thermally activated adhesive can be positioned and repositioned (before lamination) without a chance of altering the receptor surface or picking up extraneous matter as can occur with pressure sensitive adhesive layers. The physical nature of a smooth, transparent and optically clear thermally laminable adhesive layer offers better optical qualities than a pressure sensitive adhesive layer.

The thermally activated adhesive layer preferably provides the following properties:

(1) thermal laminability at a temperature below 200° C., preferably between 100° to 160° C., at a pressure of 1.6 lb/in² (0.29 kg/cm²), (2) non-tacky at room temperature or preferably not laminable to paper or self-laminable at 45° C. and 60° C., 2 g/cm², for at least one week, (3) will not discolor or alter its optical density by more than 0.05 optical density units when an area of 15,000 cm² is exposed to a 5 kW source of UV radiation having a majority of the radiation distributed over the range of 350 to 450 nm, at a distance of 1 meter for 2 minutes, and (4) have no ingredients which by themselves or in combination with the solvent of the adhesive layer migrate across a barrier layer and desensitize the colorant layer, or alter the optical qualities of the barrier or colorant layer.

Nonlimiting examples of useful thermal adhesive systems are acrylate polymers and copolymers with a laminating temperature in the range of 100° C. to 160° C. at a pressure of 1.6 lb/in² (0.29 kg/cm²) for 5–10 seconds and nonexclusively include n-butyl acrylate, ethyl acrylate, isopropyl acrylate and their copolymers with ethylenically unsaturated monomers such as other acrylates, acrylic anhydride, acrylic acid, methacrylic acid, styrene, vinyl acetate, and the like. Any monomers that cause yellowing or discoloration when exposed to 5 kW UV radiation at about 417 nm at 1 meter for two minutes should be avoided.

Optionally, a barrier layer can be added to the color proofing construction when preparing a single sheet proofing construction. This can be accomplished by adding the barrier layer between the colorant layer and the adhesive layer, wherein the barrier layer is farther away from the support base film than the colorant layer. Optical transparency between 100° C. and 160° C. are required. Beyond these minimal requirements, there is no criticality in the selection of the barrier layer composition. Suitable examples that can be used in this invention can be an aqueous developable functional material or an aqueous insoluble non-functional material or a mixture thereof. The thickness of the barrier layer may generally range from about 0.1 g/m² to about 0.3 g/m² (0.1 μm to 0.3 μm).

Since many photopolymerizable constructions utilizing free radical polymerization are affected by oxygen, an oxygen barrier layer is used to protect the colorant layer containing the reactive polymeric dye. Advantageously, the reactive polymeric dyes used in the present invention are relatively oxygen insensitive, thus requiring no oxygen barrier. However, an optional oxygen barrier layer is within the scope of the present invention. Such an oxygen barrier layer comprises polyvinyl alcohol, polyvinyl pyrrolidone or mixtures thereof. The oxygen barrier layer is typically positioned adjacent to at least one major surface of the colorant layer, that is, the oxygen barrier layer may be between the support base film and the colorant layer, if the support barrier layer is removeable, or the oxygen barrier layer may overlay the colorant layer on the surface away from the support base film. Transparency and satisfactory oxygen impermeability properties between 20° C. and 50° C. are required. Beyond these minimal requirements, there is no criticality in the selection of the oxygen barrier layer composition and such layers as known in the art are within the scope of the present invention.

METHOD OF USE

Fundamentally, two basic methods of development of a photoresist system can be described, these being chemical and mechanical development. Chemical development involves the swelling and solubilizing of either the unpolymerized or photodegraded portions of the resist. Mechanical development incorporates an image forming layer or sheet which interacts either with the exposed or unexposed regions such that upon mechanical exertion, such as peeling, an image is formed on both the base layer and the image forming layer. These images can either be positive or negative images for the base layer depending on the photosensitive properties of the image forming layer.

In preparing a color proof, a transparent color proofing construction is provided for each of the colors to be printed. Each of the color constructions is exposed through its respective color separation negative. Upon processing, the color in the non-image areas is removed, yielding a sheet that contains the desired color pattern in the image areas, while being colorless and transparent in the non-image areas, otherwise producing a negative imaging system. After the separate colored images are made, they are assembled together in registry on a white or otherwise suitable colored background matching the surface on which printing is to occur. Processing may include art known aqueous or may be art known dry peel apart techniques.

In preparing a surprint, the colors are processed individually and consecutively. A sheet of the color represented by the first negative to be proofed, for example yellow is prepared for processing by laminating the color sheet to a backing sheet. Pressure applied by conventional laminating apparatus with a heated roller is sufficient to achieve lamination through the thermally laminable adhesive. Following lamination, the support base film is stripped away. The colorant layer now on the backing sheet is contact exposed through the corresponding color separation negative.

The light imaged backing is then physically developed with an aqueous developing solution, brushing and wiping with a soft cloth pad to remove the reactive polymeric dye and unexposed colorant layers from the non-image (unexposed) areas to leave the latter clear and colorless. Thereby a negative image is defined, faithfully representing the reproduction and full color range which would result if the complete platemaking and printing operation (using appropriately matched ink) were carried through with that color separation negative.

A sheet of second color to be proofed, for example, magenta, is prepared in the same way by laminating it to the yellow imaged backing sheet. The corresponding color separation negative must now be positioned in exact register with the yellow image. This is commonly provided for by a preregistration of all the separation negatives and the backing sheet by a system of register marks or punches. The colorant layer (magenta) now on the yellow-imaged backing sheet is exposed and processed, as for the first color (yellow). The remaining cyan and black images are thereafter added, in turn, thus reproducing the four color negative result that would occur in printing, were printing plates employed prepared from the same color separation negatives.

Certain relationships should exist between the elements of the color proofing construction just described. Adhesive relationships must be such that, after adhesive lamination to the backing sheet, the release surface will allow stripping away the support base film without disrupting the adhesive bond. Failure must not occur at either the adhesive-backing sheet or adhesive-barrier layer bonds. When the release surface is provided by a surface coating on the support base film, it is not particularly critical whether release occurs between support base film-release layer or release layer-colorant layer. However, release is generally less efficient between two in situ formed layers and results in somewhat more likely release between the support base film and the release layer. In this event, it is of importance that the release layer be transparent and soluble in the aqueous developing solution.

The color proofing construction of the present invention is exposed imagewise to actinic light. Preferably, the wavelength of the actinic light used at the wavelength of maximum sensitivity of the colorant layer. The imagewise exposure can be carried out using known methods for light sensitive materials. Examples of suitable light sources which can be employed are a high pressure mercury arc lamp, a ultra-high pressure mercury arc lamp, a carbon arc, a xenon arc lamp, a laser, a tungsten filament incandescent lamp, a luminescent discharge tube, a cathode ray tube, sunlight, etc. The intensity of the actinic light is selected so the exposure time is in the range of from about 0.1 seconds to about 1 minutes, and more preferably from about 0.5 to about 15 seconds. Other useful light sources include various lasers, that is, argon ion, diode, excimer, and dye lasers. In the case of lasers, the exposure times are dependent upon the spatial distribution of the laser beam and power of the lasers.

After imagewise exposure, the color proofing construction is processed using an aqueous developing solution, wherein the unexposed portions of the colorant layer are dissolved away in the aqueous developing solution or using a dry peeling process, wherein the unexposed portions of the colorant layer are adhered to the dry peel receptor. The remaining areas, that is, the exposed areas of the colorant layer and the adhesive layer (if present) constitute a negative image.

The term "aqueous developing solution" as employed in the description of the present invention means water per se, mixtures of water and water-miscible organic solvents, water containing an alkaline compound, and mixtures of water, water-miscible organic solvents and an alkaline compound. Useful water-miscible organic solvents form a homogenous phase when mixed with water in particular ratios of about 50% by volume or less, preferably about 25% by volume or less and more preferably about 5 % by volume or less of the organic solvent to the total volume of the mixture. Such suitable wateromiscible organic solvents include aliphatic alcohols containing up to 6 carbon atoms, for example, methanol, ethanol, propanol, butanol, 2-propanol, t-butyl alcohol, isoamyl alcohol, and 1-hexanol. Suitable alkaline compound that can be used include sodium hydroxide, potassium hydroxide, lithium hydroxide, sodium phosphate, potassium phosphate, sodium carbonate, potassium bicarbonate, sodium carbonate, potassium bicarbonate, sodium meta-silicate, and potassium silicate. Preferably, the aqueous developing solution is water, sodium bicarbonate, potassium carbonate mixed with a suitable surfactant, such as SURFYNOL (Union Carbide).

Regardless of the presence of the water-miscible organic solvent, the amount of the alkaline compound in the aqueous developing solution should not exceed about 20% by weight, and more preferably should be from about 0.5 to 10% by weight, of the total amount of the aqueous developing solution. The pH should range from about 7 to about 13.5, which shifts to about 7 to about 12 or to a pH in the range of 7 to 11 when a water-miscible organic solvent is present.

The developing solution can also contain a surface active agent [such as those described in J. Grant, Ed. *Hackh's Chemical Dictionary*, 4th Ed., McGraw-Hill Book Co., New York (1969)].

While aqueous development generally provides a negative image color proofing construction, the reactive polymeric dyes can also be used in dry peel-apart positive image color proofing constructions, such as may be known in the art.

Objects and advantages of this invention are further illustrated by the following examples, but the particular materials and amounts thereof recited in these examples, as well as other conditions and details, should not be construed to unduly limit this invention. All materials are commercially available or known to those skilled in the art unless otherwise stated or apparent. $M_n$ is the number average molecular weight.

| Glossary | |
| --- | --- |
| ASATBA | aspartic acid tetrabutylammonium salt (as prepared in Example 24) |
| BHT | 2,6-di-tert-butyl-4-methylphenol (commercially available from Aldrich) |
| DBU | 1,8-diazabicyclo[5.4.0]undec-7-ene (commercially available from Aldrich) |
| HEMA | 2-hydroxyethylmethacrylate (commercially available from Sartomer) |
| MEK | 2-butanone, also known as methyl ethyl ketone (commercially available from Aldrich) |
| PVA | polyvinyl alcohol |
| UGRA | Target Plate Control Wedge (commercially available from Ugra, St. Gall, Switzerland |
| VAZO-64 | 2,2'-azobis(2-methylpropionitrile) (commercially available from DuPont) |

EXAMPLES

Preparation of Materials

The 4-aminostyrene was obtained from Johnson Matthey, Alfa Products, 30 Bond Street, Ward Hill, MA 01835. 1H NMR of this sample showed that it contained 3-5% 4-ethylaniline. The dye derivatives of 4-ethylaniline and 4-aminostyrene were not separated.

Example 1

This example describes the preparation of a chromium complex of the doubly deprotonated dianion of [2-[N-(2-hydroxy-3,5-dinitrophenyl)forminidoyl]-3,5-dimethoxy]phenol (1), a yellow dye precursor.

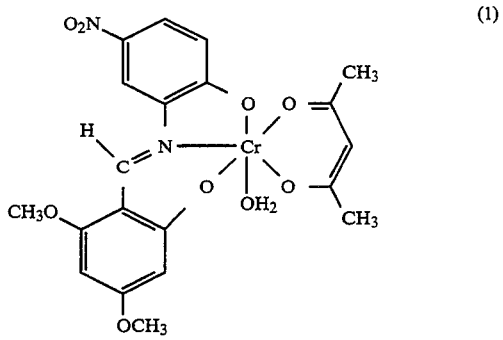

Compound 1 was prepared using procedures described in U.S. Pat. No. 3,597,200. In a 250 ml two-neck flask equipped with a Dean-Stark trap and reflux condenser were placed chromium(III) chloride hexahydrate (4.00 g, 0.015 tool), 40 ml dimethyl formamide, and 50 ml toluene. The contents of the flask were heated with separation of water as a toluene/water azeotrope. Next, 100 ml isopropanol was added followed by heating to remove the toluene as a isopropanol/toluene azeotrope. After approximately 150 ml distillate was collected, the flask was cooled and 2-hydroxy-4,6-dimethoxybenzald(2'-hydroxy-5'-nitrophenyl)imine (4.77 g, 0.015 mol) was added. The reaction mixture was then heated at 90° C. for 15 hours. The solution was cooled to 60° C. and 2,4-pentanedione (1.54 ml, 0.015 mol) and tri-n-butylamine (3.57 ml, 0.015 tool) were added and heating was continued for another 2.5 hours. The mixture was cooled and then poured into a total of 800 ml distilled water containing several drops concentrated hydrochloric acid. The resulting yellow-brown solid was dried in vacuo to afford 4.78 grams of compound 1 (58% yield); $\lambda_{max}$ (methanol)=460, 435, 405, 380, 328, 321,309 nm.

Example 2

This example describes the preparation of [2-[N-(2-hydroxy-3,5-dinitrophenyl) forminidoyl]-3,5-dimethoxy]phenol (2), a yellow free-radically polymerizable dye.

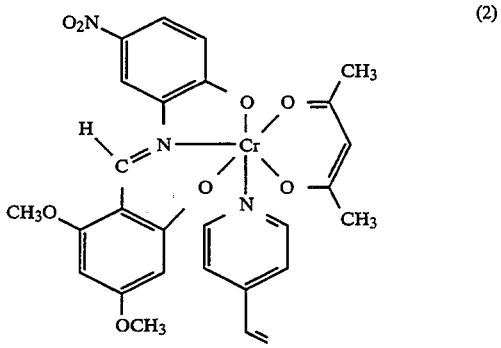

Into a 50 ml round bottom flask were placed compound 1 (0.666 g, 1.4 mmol), followed by 25 ml methylene chloride. To this solution was added 4-vinylpyridine (0.74 ml, 6.8 mmol), with continued stirring for 12 hours. The progress of this reaction was conveniently followed by thin layer chromatography. The reaction solvent was then removed under vacuum and the resulting residue washed with two portions of petroleum ether. Drying the sample under vacuum afforded 0.776 gram (98% yield) of compound 2 as a red-brown solid that was recrystallized from methylene chloride/hexane; m.p. 230° C. (dec); $\lambda_{max}$ (methanol): 439 nm ($\epsilon=14,100M^{-1}cm^{-1}$), 405 nm ($\epsilon=14,700M^{-1}cm^{-1}$), 381 nm ($\epsilon=14,600$ $M^{-}cm^{-1}$), 323 nm ($\epsilon=14,600M^{-1}cm^{-1}$).

Example 3

This example describes the preparation of aqua[4-[(N,N -dibutylaminosulfonyl-2-hydroxy-1 -naphthalenyl)azo]-2,4-dihydro-5-methyl-2-phenyl-3 H-pyrazol-3-onato(−2)](2,4-pentanedionato-O,O′)-chromium (3), a magenta precursor. Note: "Ph" designates a phenyl group.

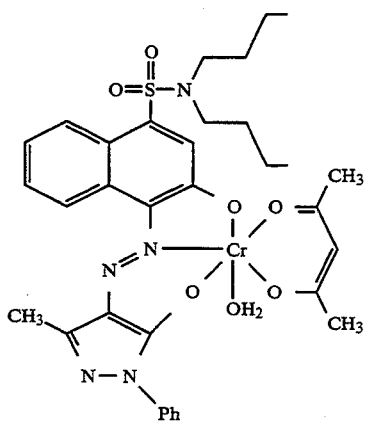
(3)

Into a 200 ml round bottom flask were placed N,N-dibutyl-3-hydroxy-4-( 5-hydroxy-3-methyl-1 -phenyl-1H-pyrazol-4-yl)azo-1-naphthalenesulfonamide (5.36 g, 10.0 mmol), chromium(III) chloride hexahydrate (3.46 g, 13.0 mmol), and 50 ml of dimethyl formamide. The reaction mixture was then heated at 130° C. for 3 hours. The resulting magenta reaction mixture was cooled to 95° C. and 2,4-pentanedione (1.54 ml, 15.0 mmol) and tri-n-butylamine (3.57 ml, 15.0 mmol) were added. After stirring at this temperature for 1.5 hours the reaction mixture was cooled to 25° C. and poured into 300 ml of distilled water containing several drops of conc. hydrochloric acid. The product was collected by vacuum filtration, washed extensively with distilled water, and dried under vacuum to afford 7.20 g (100% yield) of compound 3;$\lambda_{max}$, (methanol)=557, 522 nm.

Example 4

This example describes the preparation of [4-[(N,N-dibutylaminosulfonyl-2-hydroxy-1 -naphthalenyl)azo]-2,4-dihydro-5-methyl-2-phenyl-3H-pyrazol-3-onato (−2)](4-ethenylpyridine)(2,4-pentanedionato-O,O′)-chromium (4 ), a magenta free radically polymerizable dye.

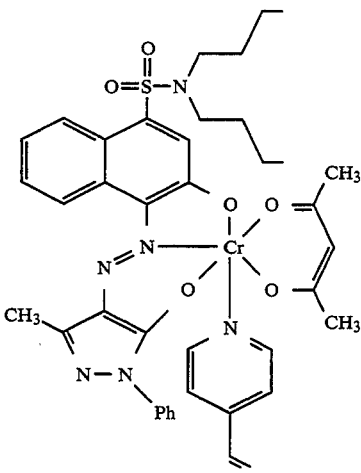
(4)

Into a 100 ml round bottom flask were placed compound 3 (1.02 g, 1.3 mmol) and 50 ml of methylene chloride. To this stirred solution was added 4-vinylpyridine (0.43 ml, 4.0 mmol). After stirring for 24 hours the solvent was removed under vacuum to afford a magenta gum. The gum was triturated by adding several portions of hexane and scraping the sides of the flask. The resulting solid was collected by vacuum filtration and dried under vacuum to afford 1.12 grams (100% yield) of compound 4. The sample was recrystallized from a mixture of toluene, methylene chloride, and heptane to give magenta crystals; m.p. 167° C; $\lambda_{max}$, (methanol)=568, 532 nm.

Example 5

This example describes the preparation of aqua[4-[(N,N -dibutylaminosulfonyl-2-hydroxy-1-naphthalenyl)azo]-2,4-dihydro-5-methyl-2-phenyl-3H-pyrazol-3-onato(−2)](2,4-pentanedionato-O,O′)-chromium (5), a magenta precursor.

(5)

Into a 200 ml round bottom flask were placed N,N-dimethyl-3-hydroxy-4-(5-hydroxy-3-methyl-1-phenyl-1H-pyrazol-4-yl)azo-1-naphthalenesulfonamide (3.70 g, 9.1 mmol), chromium(III) chloride hexahydrate (3.15 g, 11.8 mmol), and 40 ml of dimethyl formamide. The reaction mixture was then heated at 130° C. for 3 hours. The resulting magenta reaction mixture was cooled to 90° C. and 2,4-pentanedione (1.4 ml, 13.7 mmol) and tri-n-butylamine (3.3 ml, 15.0 mmol) were added. After stirring at this temperature for 1.5 hours the reaction mixture was cooled to 25° C. and poured into 500 ml of distilled water containing several drops of conc. hydrochloric acid. The product was collected by vacuum filtration, washed extensively with distilled water, and dried under vacuum to afford compound 5 as a magenta powder.

Example 6

This example describes the preparation of [4-[(N,N-dimethylaminosulfonyl-2-hydroxy-1-naphthalenyl-)azo]-2,4-dihydro-5-methyl-2-phenyl-3H-pyrazol-3-onato(−2)](4-methylcarbinolpyridine)(2,4-pentanedionato-O,O')chromium (6), a nucleophilic magenta dye.

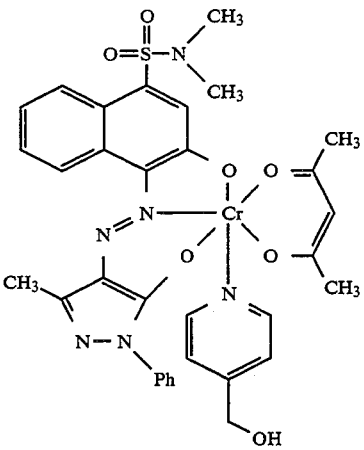

Into a 200 ml single-neck flask were placed compound 5 (3.00 g, 4.85 mmol) and 4-pyridylcarbinol (1.48 g, 13.6 mmol). To this was added 70 ml of methylene chloride and the reaction mixture stirred at 25° C. for overnight. Acetone (15 ml) was then added with continued stirring for several days at 25° C. The solvent was removed under vacuum and the resulting residue recrystallized from hot toluene/methanol to afford compound 6 as magenta crystals. $\lambda_{max}$, (methanol)=566.5, 531 nm.

Other useful polymerizable metal-azo and metal-azo methine dyes are described in U.S. Pat. No. 5,166,326 and such description is incorporated herein by reference.

Example 7

The tetrahydropyranyl derivative of 1-bromopropanol was prepared according to *J. Am. Chem. Soc.* 1972, 94, 6751.

This example describes the preparation of the 3-tetrahydropyranyl derivative of 1,4-diaminoanthraquinone-2,3-dicarboximide (7), a cyan precursor.

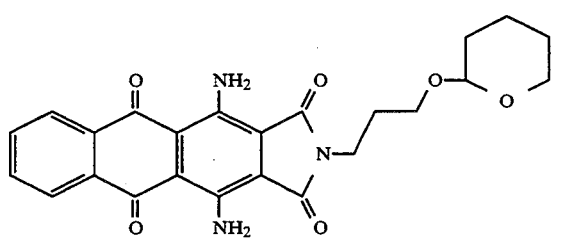

Into a 250 ml flask were placed 1,4-aminoanthraquinone-2,3-dicarboximide (4.824 g, 15.7 mmol) (BASF, Aktiengesellschaft D-6700 Ludwigshafen/RF West Germany) and 150 ml of anhydrous DMF. To this stirred solution at 25° C. was added potassium t-butoxide (95%) (1.81 g, 18.8 mmol) in small portions. After the addition was complete stirring was continued for 1 hour at 50° C. The tetrahydropyranyl derivative of 1-bromopropanol (5.86 g, 26.3 mmol) in 10 ml of anhydrous DMF was the added dropwise to the reaction mixture. The viscous solution was then stirred for about 24 hours at 50° C. The solution was cooled to 25° C. and then poured into 1 liter of distilled water. The resulting dark blue precipitate was collected by vacuum filtration and washed with several portions of distilled water. The solid material was then subjected to Soxhlet extraction using methylene chloride. Removal of the methylene chloride solvent under vacuum gave compound 7 as a deep blue solid. The $^1$H NMR spectral data of this sample was consistent with its assigned structure.

Example 8

This example describes the preparation of the 3-propanol derivative of 1,4-diaminoanthraquinone-2,3-dicarboximide (8), a nucleophilic cyan dye.

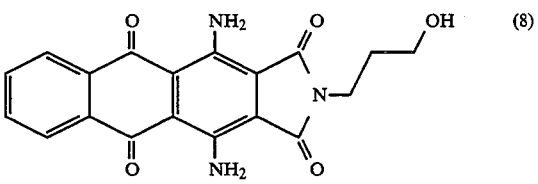

Into a 500 ml flask were placed compound 7 (2.70 g, 6.0 mmol), 110 ml of methanol, 20 ml of distilled water, and 1.5 ml of conc. sulfuric acid. The reaction mixture was then refluxed for overnight. The solution was cooled to 25° C. and the resulting dark blue solid collected by vacuum filtration and washed with several portions of methanol. After drying under vacuum compound 8 was obtained in quantitative yield. The $^1$H NMR and mass spectral data of this sample were consistent with its assigned structure.

Example 9

This example describes the synthesis of 1-(1-methylpropylamino)anthraquinone (MPAQ) (9), a free-radical polymerizable cyan precursor.

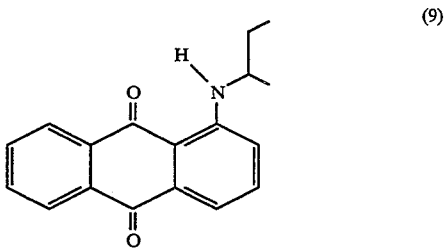

A Parr stainless steel high pressure reactor was charged with 24.26 grams (0.10 moles) of 1-chloroanthraquinone, 14.13 g (0.19 moles) of sec-butylamine, 13.05 grams (0.133 moles) potassium acetate, 0.66 gram (0.01 moles) of activated copper metal, 0.03 gram (2 mmoles) of water. The reaction vessel was sealed and heated to 180° C. in an oil bath for 12 hours. The oil bath was removed and the vessel was allowed to return to ambient condition. The solid was extracted with methylene chloride and the insoluble materials removed by filtration. The solvent was removed and the solid was recrystallized from hot methanol. The crude yield of compound 9 was 84%. The material was chromatographed on a silica gel column using toluene as the eluent. Melting point was 136°–138° C. Absorption maximum was observed at 515 nm in methylene chloride.

Example 10

This example describes the synthesis of 1-(1-methylpropylamino)-4-bromoanthraquinone (BMPAQ) (10), a free-radically polymerizable cyan precursor.

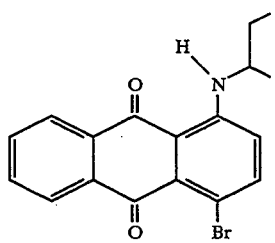
(10)

MPAQ (20.02 g, 0.072 moles) was dissolved in hot acetic acid. In a separate flask, 12.03 g (0.752 mmole) of bromine was dissolved in about 10 ml of acetic acid. The bromine solution was slowly added to the dye solution. The reaction was allowed to proceed for 0.5 hour, with occasional shaking. The reaction mixture was poured into 600 ml of water and aqueous sodium sulfite was added to discharge the bromine. The aqueous solution was decanted off. The solid was dissolved in methylene chloride and then concentrated and slowly added to cold methanol where upon a solid precipitated. The yield was 21.76 grams (85%) of compound 10. Absorption maximum was observed at 515 nm in methylene chloride.

Example 11

This example describes the synthesis of 1-(1-methylpropylamino)4-(4-styrylamino)-anthraquinone (11 ), a free-radically polymerizable cyan dye.

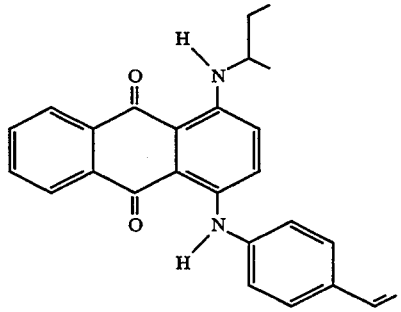

A 100 mL round bottom was charged with 3.0 grams (8.4 mmoles) of BMPAQ (10) 1.5 grams, (12.6 mmoles) of 4-aminostyrene 2.0 grams (20.4 mmoles) of potassium acetate 0.2 gram ( 1.1 mmoles) of copper(II) acetate monohydrate, and 12 ml of nitrobenzene. The mixture was refluxed for 1 hour. By TLC, some starting material was still present, however, a dark blue low $R_f$ spot was also apparent, presumably, a polymeric material. The solvent was removed by vacuum distillation and the material was dissolved in toluene and then filtered. The filtrate was chromatographed on a silica column using toluene as the eluent. The starting material came off before the desired product. A higher purity sample was prepared by recrystallizing the material from methylene chloride/methanol, followed by chromatography. The absorption maximum was observed at 651 nm in methylene chloride. The melting point was 142° C. $^1$H NMR (CD$_2$Cl$_2$) d 12.26 (brs, 1H), 10.88 (brs, 1H), 8.32 (m, 2H), 7.72 (m, 2H), 7.63 (d, J=9.5 Hz, 1H), 7.45 (d, J=8.2 Hz, 2H), 7.22 (m, 3H), 6.73 (dd, J=17.6 Hz, 10.9 Hz, 1H), 5.73 (d, J=17.6 Hz, 1H), 5.22 (d, J=10.7 Hz, 1H), 3.73 (brm, 1H), 1.71 (m, 2H) 1.32 (d, J=6.35 Hz, 3H), 1.02 (t, J=7.4 Hz, 3H).

Example 12

This example describes the synthesis of 1-(4-styrylamino)anthraquinone (STYAQ) (12), a free-radically polymerizable magenta dye.

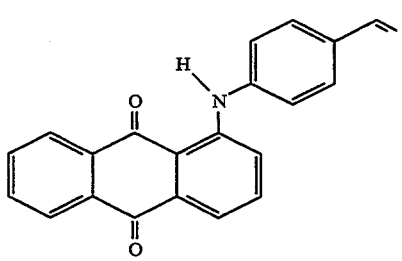
(12)

Into a 100 ml round bottom equipped with a reflux condenser and was added 3.5 grams of 1-chloroanthraquinone, 2.5 grams of 4-aminostyrene, 2.6 grams of potassium acetate, 0.15 gram of copper(II) acetate monohydrate, 17 mi of nitrobenzene. The above mixture was refluxed for 50 minutes under a nitrogen blanket. By TLC most of the starting material was gone and some low $R_f$ material was apparent. The solvent was removed by vacuum distillation. The solid was extracted with toluene and chromatographed on a silica column using toluene as an eluent. Two dark red fractions were collected, the less polar fraction was 1-(4-styrylamino)anthraquinone (STYAQ) (12). The more polar red fraction was a 4-aminostyrene addition product to STYAQ, where the amine is added to the benzylic position. The melting point of STYAQ is 174° C. The absorption maximum is 512 nm in methylene chloride. $^1$H NMR (CD$_2$Cl$_2$) d 11.34 (s, 1H), 8.25 (m, 2H), 7.76 (m, 2H), 7.67 (dd, J=7.0 Hz, 1.4 Hz, 2H), 7.43 (m, 4H), 7.28 (d, J=8.4 Hz, 2H), 6.73 (dd, J=11.0 Hz, 17.6 Hz, 1H), 5.74 (d, J=17.6 Hz, 1H), 5.24 (d, 10.7 Hz, 1H). The addition product structure was determined by proton NMR and confirmed by laser mass spectroscopy. Negative-ion laser desorption revealed a parent ion peak at m/z 444 mass units, the most intense feature was at m/z 325, corresponding to loss of an aminostryene (NH$_2$C$_6$H$_4$C$_2$H$_3$). The positive-ion laser desorption spectrum shows a molecular ion at m/z at 326 corresponding to a loss of the aminostyryl radical (NHC$_6$H$_4$C$_2$H$_3$), but no parent ion. The maximum absorption of the addition product was observed at 511 nm methylene chloride. $^1$H NMR (CD$_2$Cl$_2$), d 11.32 (s, 1H), 8.29 (dd, J=7.6 Hz, 1.6 Hz, 1H), 8.22 (dd, J=7.4 Hz, 1.6 Hz, 1H), 7.77 (m, 2H), 7.65 (dd, J=6.3, 2.1 Hz, 1H), 7.48 (m, 2H), 7.41 (d, J=8.4 Hz, 2H), 7.28 (d, J=8.4 Hz, 2H), 7.17 (d, J=8.6 Hz, 2H), 6.56 (dd, J=17.6 Hz, 10.9 Hz, 1H), 6.50 (d, J=8.6 Hz, 2H), 5.48 (d, J=17.6 Hz, 1H), 4.97 (d, J=10.9 Hz, 1H), 4.54 (q, J=6.6 Hz, 1H), 4.27 (brs, 1H), 1.54 (d,J=6.7 Hz, 3H).

Examples 13-14

This example describes the synthesis of 1-(2-aminoethylamino)anthraquinone (13) and 1-(3-aminopropylamino)anthraquinone (14), magenta nucleophilic dyes.

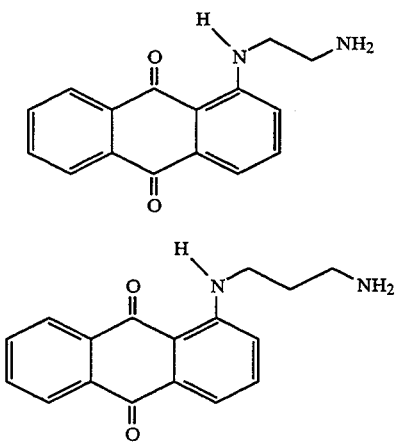

These were prepared by a modification of a literature procedure for 1-(2-aminoethylamino)anthraquinone where an excess of the amine was reacted with 1-chloroanthraquinone, instead of 1-nitroanthraquinone, and the mixture refluxed for 20 min (U.S. Pat. No. 2,888,379). The structures were confirmed by $^1$H NMR spectroscopy. The propyl derivative had an absorption maximum at 510 nm and the ethyl derivative had a maximum at 505 nm in methylene chloride.

Examples 15-23

Examples 15-23 described the synthesis of reactive macromolecular dyes, either incorporating free radically polymerizable dyes into the backbone via copolymerization with azlactone (Examples 15, 17-18, and 21-23) or incorporating the dyes pendent to the polymerized azlactone backbone (Examples 16, and 19-20).

In the following examples, the portion of the macromolecular dye described by:

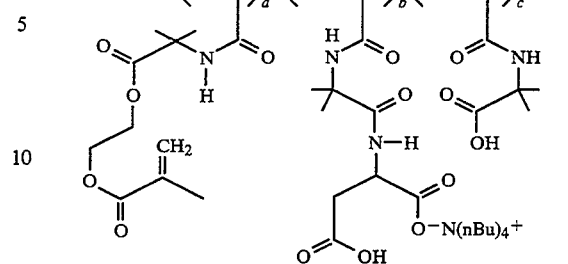

will be conveniently represented by the following:

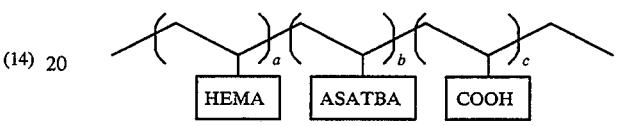

Example 15

This examples describes the synthesis of a reactive copolymeric yellow dye:

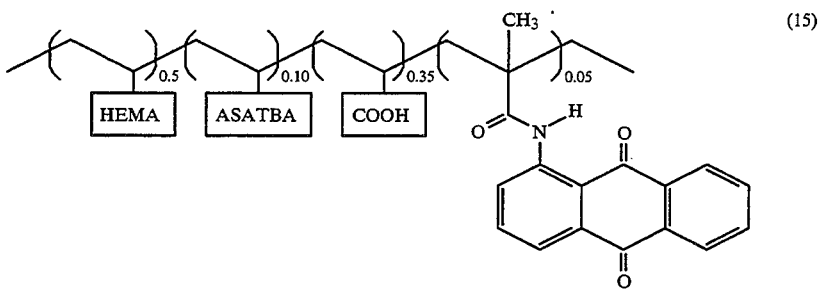

Into a vessel 18.0 parts by weight of azlactone monomer, 2.0 parts by weight of a 1-methacrylamidoanthraquinone (a yellow dye) prepared using a slight modification of a literature procedure (GB Patent No. 1,06,700) (modification involved heating 1-aminoanthraquinone in o-dichlorobenzene solution to about 140°-150° C. prior to addition of the sodium carbonate), 0.40 parts by weight of VAZO-64 and 40 parts by weight of MEK were charged. The solution was purged with nitrogen for 10 minutes. The vessel was sealed and put into a constant temperature bath and heated at 65° C. for 20 hours. Solids analysis revealed a quantitative reaction (no detectable monomer remained) to afford the yellow copolymer.

Into the vessel 0.49 parts by weight of DBU, 8.42 parts by weight of MEK and 0.11 parts by weight of BHT were added. To this mixture 8.42 parts by weight of HEMA and 8.42 parts by weight of MEK were added. The solution was heated at 50° C. for 1 hour. An infrared (IR) spectrum analysis revealed a complete reaction to afford the HEMA adduct.

Into the vessel 4.84 parts by weight of ASATBA (as prepared in Example 24) in 9.69 parts by weight of MEK were added and the solution was stirred for 30 minutes. Then 0.40 parts by weight of DBU, 0.04 parts by weight of BHT and 3.74 parts by weight of deionized water were added. The solution was heated at 50° C., after 11 hours an IR spectrum analysis revealed a complete reaction to afford the reactive copolymeric yellow dye.

Example 16

This examples describes the synthesis of reactive polymeric cyan dye:

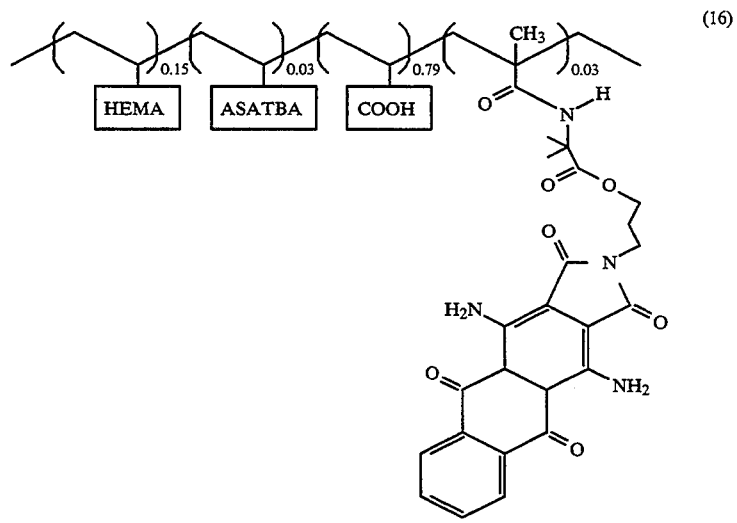

Into a vessel 351.0 parts by weight of azlactone monomer, 7.0 parts by weight of VAZO-64 and 702.0 parts by weight of MEK were charged. This solution was purged with nitrogen for 10 minutes and the solution was heated to 60° C. for 3 hours. The temperature of the solution was raised to 80° C. and held at this temperature for 2 hours. Solids analysis revealed a quantitative reaction to afford an azlactone homopolymer without any detectable remaining monomeric azlactone.

Into a vessel 21.08 parts by weight of the above azlactone polymer solution, 0.17 parts by weight of DBU and 2.85 parts by weight of MEK were charged. To this a premix of 2.85 parts by weight of HEMA, 0.04 parts by weight of BHT and 2.85 parts by weight of MEK were added. The reaction was heated at 50° C. for 1 hour.

1,4-Diaminoanthraquinone-2,3-dicarbonylimide (a blue dye prepared according to Example 8) (1.94 parts by weight in 3.88 parts by weight of MEK) was added to the flask and the mixture was heated at 50° C. for 1 hour.

Then 2.05 parts by weight of ASATBA dissolved in 4.10 parts by weight of MEK were added. The mixture was heated at 50° C. for 1 hour.

Into the vessel 0.17 parts by weight of DBU and 0.80 parts by weight of deionized water and 0.017 parts by weight of BHT were added. The mixture was heated at 50° C., after 11 hours IR spectrum analysis revealed a quantitative reaction to afford the reactive polymeric cyan dye.

Example 17

This example describes the synthesis of a reactive copolymeric yellow dye:

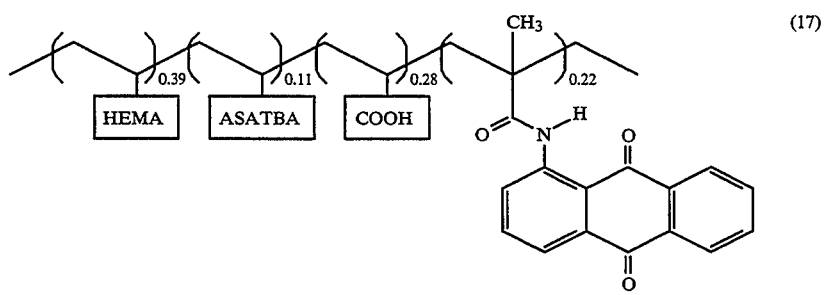

Into a vessel 5.0 parts by weight of alkenylazlactone monomer, 2.65 parts by weight of a 1-methacrylamidoanthraquinone (a yellow dye) prepared using a slight modification of a literature procedure (GB Patent No. 1,036,700) (modification involved heating the 1-aminoanthraquinone in o-dichlorobenzene solution to about 140°–150° C., prior to addition of the sodium carbonate), 0.15 parts by weight of VAZO-64 and 30.1 parts by weight of tetrahydrofuran (THF) were charged. The solution was purged with nitrogen for 5 minutes. The vessel was sealed land placed in a constant temperature water bath at 65° C. for 20 hours. A percent solids determination indicated a quantitative conversion to afford a yellow copolymer.

To this mixture 0.109 parts by weight of DBU. 0.01 parts by weight of BHT and 1.87 parts by weight of HEMA were added. The vessel was heated at 50° C. for 30 minutes, then 1.34 parts by weight of ASATBA dissolved in 1.3 parts by weight of THF were added and stirred at 30° C. for 2 hours.

Then 0.14 parts by weight of DBU and 1.29 parts by weight of deionized water were added to the vessel. The reaction solution was heated for 4 hours at 40° C. in a constant temperature water bath. IR analysis indicated a quantitative reaction to afford the reactive copolymeric yellow dye.

Example 18

This example describes the synthesis of a reactive polymeric magenta dye:

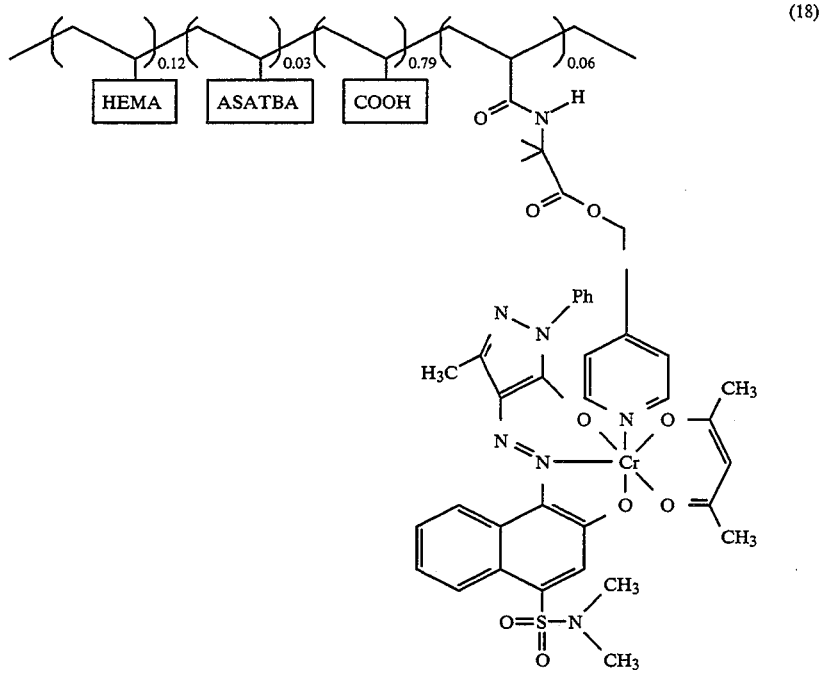

(18)

Into a vessel 100 parts by weight of azlactone monomer, 2.0 parts by weight of VAZO-64 and 200 parts by weight of MEK were charged. The solution was purged with nitrogen for 10 minutes. The vessel was sealed and placed in constant temperature water bath at 65° C. for 20 hours. A viscous polymer solution was obtained. A percent solids analysis indicated a quantitative reaction to afford an azlactone homopolymer.

A flask was fitted with a condenser, a magnetic stirrer and a thermometer and was charged with 2.31 parts by weight of the above polymer solution. A solution consisting of 0.51 parts by weight of [4-[N,N-dimethylaminosulfonyl-2-hydroxy- 1-naphthalenyl)azo]-2,4-dihydro-5-methyl-2-phenyl-3H-pyrazol-3-onato (−2)](4-methylcarbinolpyridine)(2,4-pentanedianato-O,O′)chromium (a magenta dye prepared in Example 6) dissolved in 3 parts by weight of MEK were added to the flask and 0.010 parts by weight of DBU was added. The reaction solution was heated at 50° C. for 2 hours. The flask was cooled to room temperature and 0.265 parts by weight of HEMA, 0.01 parts by weight of BHT and 0.265 parts by weight of MEK were added. The solution was heated at 50° C. for 2 hours. Then 0.20 parts by weight of ASATBA dissolved in 0.60 parts by weight of MEK was added and the solution was heated at 50° C. for 1 hour. To the flask was added 0.16 parts by weight of deionized water and 0.005 parts by weight of DBU. The solution was heated at 50° C. for 11 hours. An IR analysis indicated quantitative reactions

Example 19

This example describes the synthesis of a reactive polymeric magenta dye:

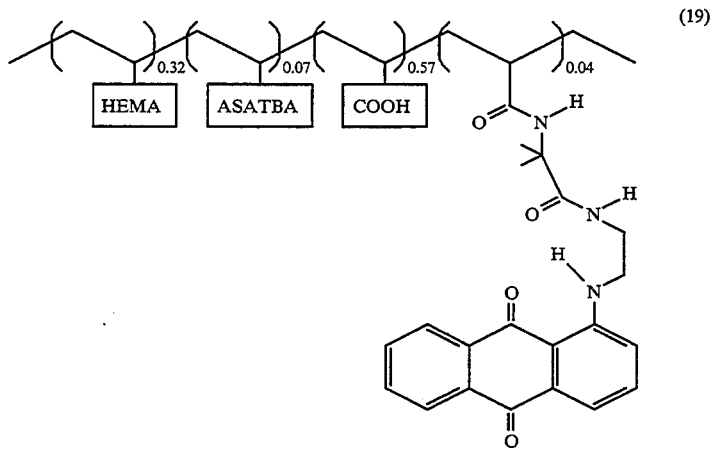

(19)

Into a vessel 100 parts by weight of alkenylazlactone monomer, 2.0 parts by weight of VAZO-64 and 200 parts by weight of MEK were charged. The solution was purged with nitrogen for 10 minutes. The vessel was sealed and placed in a constant temperature water bath at 65° C. for 20 hours. A viscous polymer solution was obtained. A percent solids analysis indicated a quantitative reaction to afford an azlactone homopolymer.

To 31.0 parts by weight of the above solution 0.25 parts by weight of DBU, 0.01 parts by weight of BHT and 8.62 parts by weight of MEK were added. Then 4.31 parts by weight of HEMA were added. The solution was heated for 2 hour at 50° C.

Into the vessel 0.98 parts by weight of 1-(2-aminoethylamino)anthraquinone (a dye prepared in Example 13) in 7.0 parts by weight of MEK were added. The mixture was stirred for 30 minutes. Then 2.76 parts by weight of ASATBA in 5.52 parts by weight of MEK were added, To this solution 0,25 parts by weight of DBU and 1.06 parts by weight of deionized water were added, The solution were heated for 19 hours at 50° C., An IR analysis indicated a quantitative reaction.

for 20 hours. A percent solids analysis indicated a quantitative conversion to afford a yellow copolymer.

To 30.0 parts by weight of the above polymer solution 0.15 parts by weight of DBU, 0.020 parts by weight of BHT and 5.10 parts by weight of MEK were added. Then 2.55 parts by weight of HEMA was added to the vessel. The solution were stirred at 50° C. for 1 hour.

A solution of 1.47 parts by weight of ASATBA dissolved in 2.93 parts by weight of MEK was added to the vessel. The solution were stirred for 1 hour. Then 0.15 parts by weight of DBU and 1.12 parts by weight of deionized water were added to the vessel. The solution were heated at 50° C. for 20 hours. An IR spectrum analysis indicated a quantitative reaction to afford a reactive copolymeric yellow dye.

Example 21

This example describes the synthesis of a reactive copolymeric magenta dye:

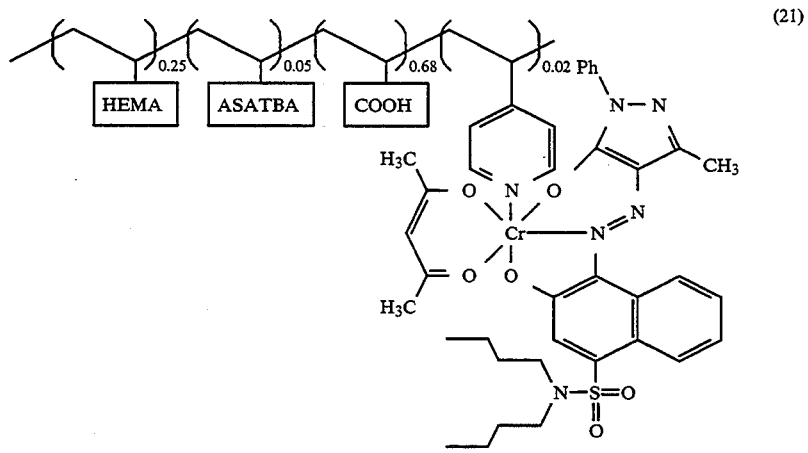

(21)

Example 20

This example describes the synthesis of a reactive copolymeric yellow dye:

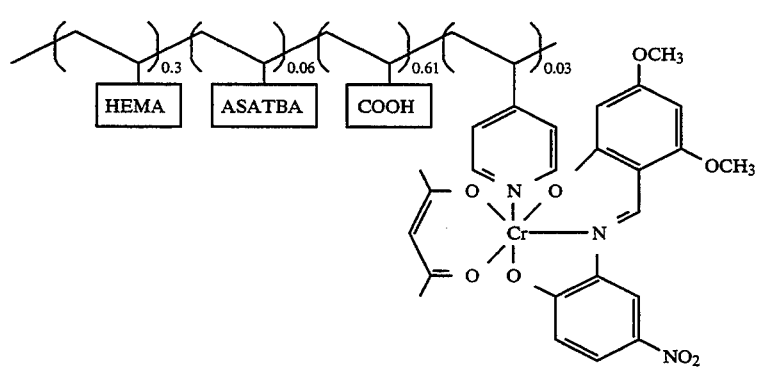

(20)

Into a vessel 9.1 parts by weight of alkenylazlactone, 1.0 parts by weight of 6-[[(2-hydroxy-5-nitrophenyl-)imino]methyl]-3,5-dimethoxyphenolato-N,O,O'](4-(2,4-pentanedionato-O,O')chromium (a yellow free-radically polymerizable dye prepared in Example 2), 0.2 parts by weight of VAZO-64 and 40 parts by weight of MEK were charged. The solution were purged with nitrogen for 10 minutes. The vessel were sealed and placed in a constant temperature water bath at 65° C.

Into a vessel 9.0 parts by weight of alkenylazlactone monomer, 1.0 parts by weight of [4-[(N,N-dibutylaminosulfonyl-2-hydroxy-1-naphthalenyl)azo]-2,4-dihydro-5-methyl-2-phenyl-3H-pyrazol-3-onato(-2)](4-ethenylpyridine)(2,4-pentanedionato-O,O')-chromium (a dye prepared in Example 4), 0.2 parts by weight of VAZO-64 and 20 parts by weight of MEK were charged. The solution was purged with nitrogen for 10 minutes. The vessel was sealed and placed in a constant temperature water bath at 60° C. for 24 hours. A viscous polymer solution was obtained. A percent solid analysis indicated a quantitative conversion to afford a magenta copolymer.

Into a vessel, the following components were added: 15 parts by weight of the above copolymer solution, 0.12 parts by weight of DBU, 0.04 part by weight of BHT and 4.16 parts by weight of MEK. Then 2.08 parts by weight of HEMA were added. The solution was heated at 50° C. for 2 hours.

A solution of 1.2 parts by weight of ASATBA in 2.4 parts by weight of MEK were added to the flask. The solution was stirred for 10 minutes, then 0.1 parts by weight of DBU and 1.0 parts by weight of deionized water were added. The reaction solution was heated at 50° C. for 22 hours. The completeness of the reaction was confirmed by IR analysis.

Example 22

This example describes the synthesis of a reactive blue polymeric dye:

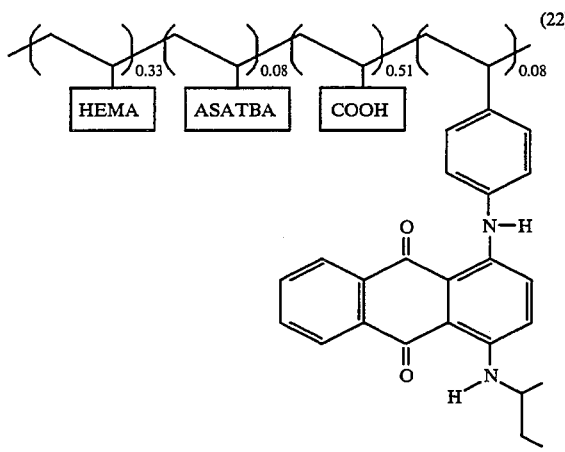

Into a vessel 1.64 parts by weight of azlactone monomer, 0.41 parts by weight of 1-(1-methylpropylamino)-4-(4-styrylamino)-anthraquinone (a blue dye prepared in Example 11), 0.04 parts by weight of VAZO-64 and 10.0 parts by weight of MEK were charged. The solution was purged with nitrogen for 5 minutes. The vessel was sealed and placed in a constant temperature water bath at 60° C. for 17 hours. A percent solid analysis indicated a quantitative conversion to afford a blue copolymer.

To 10.0 parts by weight of the above polymer solution were added 0.029 parts by weight of DBU, 0.005 parts by weight of BHT, 1.02 parts by weight of MEK and 0.51 parts by weight of HEMA. The solution was stirred for 30 minutes and then heated at 50° C. for 30 minutes with stirring. An IR spectrum indicated a complete reaction with HEMA.

The reaction mixture was cooled to room temperature and ASATBA (0.366 parts by weight) dissolved in 0.73 parts by weight of MEK was added to the vessel and stirred for 30 minutes. Then 0.037 parts by weight of DBU and 0.35 parts by weight of deionized water were added to the flask. The solution was heated at 50° C. for 10 hours. An IR spectrum analysis revealed quantitative reaction to afford a reactive blue copolymeric dye.

Comparative Example 23

This example describes the synthesis of a reactive polymer without a chromophoric moiety.

Into a reactor fitted with a condenser, a mechanical stirrer and a thermometer was charged 132.0 parts by weight of azlactone monomer, 264.0 parts by weight of MEK and 2.64 parts by weight of VAZO-64. The solution was purged for 10 minutes with nitrogen and kept under a nitrogen blanket throughout the reaction. The solution was heated at 60° C. with agitation for 3.5 hours. The reaction was monitored by a percent solid analysis and revealed quantitative conversion. The temperature of the solution was raised to 80° C. and maintained at this temperature for 2 hours then allowed to cool to room temperature.

The solution was purged with a 90/10 nitrogen/oxygen mixture throughout the reaction. After 10 minutes 3.64 parts by weight of DBU were added to the solution and agitated. A premix of 61.8 parts by weight of HEMA 0.79 parts by weight of BHT and 123.6 parts by weight of MEK were added to the solution at such a rate to maintain the temperature below 40° C. (the reaction is exothermic). After the addition of the premix solution, the reaction mixture was stirred for 1 hour. The solution was then heated at 50° C. for 1 hour. An IR spectrum and GC analysis indicated a quantitative reaction with HEMA.

The solution was cooled to 35° C. and a premix of 35.5 parts by weight of ASATBA with 71.3 parts by weight of MEK were added. The solution was stirred for 30 minutes and the temperature elevated to 50° C. and held at this temperature for 1 hour. The reaction was monitored by IR and after 1 hour, revealed a quantitative reaction with ASATBA.

The solution was cooled to room temperature and 2.90 parts by weight of DBU, 0.29 parts by weight of BHT and 13.4 parts by weight of deionized water were added. The stirred solution was heated at 50° C. for 3 hours and 13.4 parts by weight of deionized water were added to the solution with continued heating at 50° C. for 8 hours. The solution was cooled to room temperature and an IR spectrum analysis indicated a quantitative reaction with water to afford a reactive polymer. There were no detectable azlactone rings remaining.

Example 24

This example describes the synthesis of aspartic acid tetrabutylammonium salt (ASATBA).

Into a vessel 50.0 parts by weight of aspartic acid and 68.0 parts by weight of deionized water were charged. To this solution 255.87 parts by weight of tetrabutylammonium hydroxide (40% solution in water) were added slowly with agitation. The solution gave a clear solution after mixing. The water was evaporated off under vacuum at 40° C. to yield a viscous clear liquid that was soluble in MEK.

Comparative Example 25

A coating solution formulation utilizing the reactive azlactone polymer as prepared in Comparative Example 23 along with a monomeric metal-azo magenta dye as prepared in Example 4 for an overlay proofing construction is given below:

| Component (% Solids) | Wt (g) | Wt solids (g) | % Solids |
|---|---|---|---|
| multifunctional oligomer (50%) | 1.817 | 0.909 | 43.2 |
| reactive polymer (33%) (Example 23) | 2.348 | 0.775 | 36.8 |
| MEK | 5.430 | — | — |
| wetting agent | 0.062 | 0.062 | 3.0 |
| monomeric colorant | 0.240 | 0.240 | 11.4 |

-continued

| Component (% Solids) | Wt (g) | Wt solids (g) | % Solids |
|---|---|---|---|
| photoinitiator | 0.119 | 0.119 | 5.7 |
| Total | 10.01 | 2.105 | 100.1 |

The multifunctional oligomer, a hexafunctional acrylate was derived from TDI (toluene diisocyanate) and prepared as described in U.S. Pat. No. 4,316,949 and such description is incorporated herein by reference. MEK is a nonchlorinated hydrocarbon solvent. The wetting agent (commercially available from 3M Co. under the trade name "Fluorinert FC 430") is included to improve wetting of the formulation during the coating step. The colorant was a chromium based polymerizable metal-azo dye (as prepared in Example 4). The photoinitiator used was 2,4-bis(trichloromethyl)-6-(3'-(2'-hydroxyethoxy)styryl)-s-triazine.

The colorant formulation was coated onto 2 mil PET (commercially available from ICI Americas under the trade designation "505") using a #15 wire-wrapped Meyer bar, dried in a convection oven at 200° F. for 2 minutes and gave a dry coating weight of approximately 1.3 g/m². The coated construction was then exposed imagewise through a set of four Plate Control Wedge targets (Ugra, St. Gall, Switzerland, "UGRA target") to actinic radiation using a Berkey-Ascor 5 kW vacuum frame exposure unit such that each target was exposed for 50, 60 70 and 80 units, respectively, at high intensity in increments of 10 units. An exposure of 40 units corresponded to 15 seconds. The imagewise exposed construction was developed using an aqueous developer solution comprised of 1% $KHCO_3$, 1% $Na_2CO_3$, 0.1% SURFYNOL 465 (pH of 10.2).

The image of the developed construction was evaluated by eye using a ten power eyepiece on a light table. The best image resulted from 60 units, (22 seconds), which gave a solid four on a $\sqrt{2}$ graduated greyscale. The 2% and 98% hard dots and screens where held as were the positive and negative six microlines. The reflective optical density after development was 1.25, the transparency 2.88, the $\Delta E$ (in the developed regions) was 9.67. The background toning as represented by $\Delta E$ was high due to the monomeric nature of the colorant.

Comparative Example 26

The same colorant formulation as Comparative Example 25 was used for a single sheet construction. It was coated onto a PET with a release layer (commercially available from ICI, Americas) using a #15 Meyer bar and was dried in a convection oven for two minutes at 200° F. This layered construction was then coated with an acrylic thermal adhesive (commercially available from Reichold Chemical under the trade designation "97603") using a #6 Meyer bar, dried for 2 minutes at 200° F. in a convection oven, and gave a dry coating weight of approximately 1.5 g/m². This layered construction was then laminated to a commercially available paper base (coated on both sides with polypropylene) using a hot roll lamination processor operating at 280° F. for the upper roll and 180° F. for the lower roll and a transport speed of 4.

The polyester carrier sheet was removed and the layered construction was exposed to actinic radiation using a Berkey-Ascor 5 kW vacuum frame exposure unit through a set of four UGRA targets with 50 to 80 units at high intensity in increments of 10 units. The imagewise exposed construction was developed using the aqueous developer solution described in Comparative Example 25. The 60 unit exposure gave the best image as determined by eye using a 10× eye piece. The image displayed 2% and 98% dots and screens and complete 8 positive and negative microlines. The background $\Delta E$ for this construction was 18.72. Due to the ability of the monomeric colorant to migrate into the adhesive layer, the $\Delta E$ was unacceptably high.

Example 27

A metal-azo magenta dye as prepared in Example 4 was copolymerized with alkenylazlactone monomers to give an azlactone/colorant copolymer, which was then functionalized to give 25% HEMA, 5% aspartate, and 68% carboxylate. There was 2 mole % of the polymerizable metal-azo magenta in the copolymer. The formulation is given below:

| Component (% Solids) | Wt (g) | Wt solids (g) | % Solids |
|---|---|---|---|
| multifunctional oligomer (50%) | 1.821 | 0.911 | 47.8 |
| reactive polymer (33%) Example (21) | 2.445 | 0.807 | 42.3 |
| MEK | 9.834 | — | — |
| wetting agent | 0.075 | 0.075 | 3.9 |
| photoinitiator | 0.115 | 0.115 | 6.0 |
| Total | 14.290 | 1.908 | 100.0 |

The wetting agent, photoinitiator and multifunctional oligomer used were those described in Comparative Example 25. This colorant formulation was coated onto polyester (commercially available from ICI, under the trade designation of 505) using a #26 Meyer bar, dried in a convection oven at 200° F. for 2 minutes and gave a coating weight of approximately 1.3 g/m². This colored construction was exposed to actinic radiation using a Berkey-Ascor 5 kW vacuum frame exposure unit through a set of five UGRA targets with 30–70 units at high intensity in increments of 10 units. The imagewise exposed construction was developed using the aqueous developer solution described in Comparative Example 25. The 60 unit exposure gave the best image as determined by eye using a 10× eye piece. The image displayed 2% and 98% dots and screens and complete 6 positive and negative microlines. This had a reflective optical density=1.34, transparency=2.82, and a background $\Delta E=0.83$. The background toning was dramatically decreased since the colorant was attached to the polymer.

Example 28

A reactive magenta copolymer dye containing coating solution formulation as prepared in Example 27, for a single sheet color proofing application is given below:

| Component | Wt (g) | Wt solids (g) | % Solids |
|---|---|---|---|
| multifunctional oligomer (50%) | 0.826 | 0.413 | 43.2 |
| reactive polymer (33%) Example (21) | 1.468 | 0.484 | 50.6 |
| MEK | 2.947 | — | — |
| wetting agent | 0.026 | 0.026 | 2.7 |
| photoinitiator | 0.034 | 0.034 | 3.6 |
| Total | 5.301 | 0.957 | 100.0 |

The wetting agent, photoinitiator and multifunctional oligomer used were those described in Comparative Example 25. This colorant formulation was coated onto a release layer coated polyester using a #26 Meyer bar, dried in a convection oven at 200° F. for 2 minutes, and gave a coating weight of approximately 1.8 g/m². A barrier solution prepared using 5% of the functionalized reactive polymer prepared in Example 23, 3% of the multifunctional oligomer, and 1% 2,4-bis(trichloromethyl)-6-(3'-(2'-hydroxyethoxy)styryl)-s-triazine in MEK was coated onto the color layer using a #6 Meyer bar, dried for 2 minutes in a convection oven at 200° F. and gave a coating weight of approximately 0.5 g/m². This layered construction was then coated with an acrylic thermal adhesive (commercially available from Reichold Chemical under the trade designation "97603") using a #6 Meyer bar, dried for 2 minutes at 200° F. in a convection oven, and gave a dry coating weight of approximately 1.5 g/m². This layered construction was then laminated to a commercially available paper base (coated on both sides with polypropylene) using a hot roll lamination processor operating at 280° F. for the upper roll and 180° F. for the lower roll and a transport speed of 4.

The polyester support film was removed and the construction exposed to actinic radiation using a Berkey-Ascor 5 kW vacuum frame exposure unit through a set of five UGRA targets with 20–100 units at high intensity in increments of 20 units. The imagewise exposed construction was developed using the aqueous developer solution described in Comparative Example 25. The 60 unit exposure gave the best image as determined by eye using a 10× eye piece. The image displayed 2% and 98% dots and screens and complete 8 positive and negative microlines. The reflective optical density=1.46, background ΔE=0.90.

Example 29

A polymerizable metal-azo methine yellow was copolymerized with alkenylazlactone monomers to give a reactive copolymeric dye, which was then functionalized to give 30% HEMA, 6% aspartate, and 61% carboxylate. There was 3 mole % of the polymerizable metal-azo methine yellow in the copolymer. The formulation is given below:

| Component (% Solids) | Wt (g) | Wt solids (g) | % Solids |
|---|---|---|---|
| multifunctional oligomer (50%) | 1.912 | 0.956 | 24.6 |
| reactive polymer (33%) Example 20 | 8.262 | 2.727 | 70.2 |
| MEK | 10.337 | — | — |
| wetting agent | 0.080 | 0.080 | 2.1 |
| photoinitiator | 0.122 | 0.122 | 3.1 |
| Total | 20.713 | 3.885 | 100.0 |

The wetting agent, photoinitiator and multifunctional oligomer used were those described in Comparative Example 25. This colorant formulation was coated onto 2 mil polyester (commercially available from ICI Americas, under the trade designation "505") using a #18 Meyer bar, and dried in a convection oven at 200° F. for 2 minutes. The colored construction was exposed to actinic radiation using a Berkey-Ascor 5 kW vacuum frame exposure unit through a set of five UGRA targets with 30–70 units at high intensity in increments of 10 units.

The imagewise exposed construction was developed using the aqueous developer solution described in Comparative Example 25. The 60 unit exposure gave the best image as determined by eye using a 10× eye piece. The image displayed 2% and 98% dots and screens and complete 8 positive and negative microlines. The reflective optical density=0.95, transparency=2.80, background ΔE=0.41.

Example 30

A nucleophilic anthraquinone magenta dye was introduced into polymerized azlactone to give 4% by weight of a sidechain colorant. The rest of the azlactone rings were functionalized to give 32% HEMA, 7% aspartate, and 57% carboxylate. There was 4 mole % of the nucleophilic anthraquinone magenta dye in the copolymer. The formulation is given below:

| Component (% Solids) | Wt (g) | Wt solids (g) | % Solids |
|---|---|---|---|
| multifunctional oligomer (50%) | 0.751 | 0.376 | 37.3 |
| reactive polymer (16.6%) Example 19 | 3.013 | 0.500 | 49.6 |
| MEK | 2.647 | — | — |
| wetting agent | 0.056 | 0.056 | 5.6 |
| photoinitiator | 0.077 | 0.077 | 7.6 |
| Total | 6.544 | 1.009 | 100.1 |

The wetting agent, photoinitiator and multifunctional oligomer used were those described in Comparative Example 25. This was coated onto polyester (commercially available from ICI Americas, under the trade designation "505") using a #6 Meyer bar and dried in a convection over at 200° F. for 2 minutes. The colored construction was exposed to actinic radiation using a Berkey-Ascor 5 kW vacuum frame exposure unit through an UGRA target with 10–100 units at high intensity in increments of 10 units.

The imagewise exposed construction was developed using the aqueous developer solution described in Comparative Example 25. The 50 unit exposure gave the best image as determined by eye using a 10× eye piece. The image displayed 2% and 98% dots and screens and complete 8 positive and negative microlines. The reflective optical density=0.82, transparency=2.48, background ΔE=0.91.

Example 31

A polymerizable anthraquinone yellow dye was copolymerized with azlactone monomers to give a reactive copolymeric dye, which was then functionalized to give 50% HEMA, 10% aspartate, and 35% carboxylate. There was 5.0 mole % of the polymerizable anthraquinone yellow in the copolymer. The formulation is given below:

| Component (% Solids) | Wt (g) | Wt solids (g) | % Solids |
|---|---|---|---|
| multifunctional oligomer (50%) | 1.907 | 0.954 | 24.2 |
| reactive polymer (33.7%) Example 15 | 8.258 | 2.783 | 70.6 |
| MEK | 9.834 | — | — |
| wetting agent | 0.088 | 0.088 | 2.2 |
| photoinitiator | 0.177 | 0.117 | 3.0 |
| Total | 20.913 | 3.942 | 100.0 |

The wetting agent, photoinitiator and multifunctional oligomer used were those described in Comparative Example 25. This colorant formulation was coated onto polyester (commercially available from ICI Americas, under the trade designation "505") using a #34 Meyer bar and dried in a convection oven at 200° F. for 2 minutes. The colored construction was exposed to actinic radiation using a Berkey-Ascor 5 kW vacuum frame exposure unit through an UGRA target with 20-100 units at high intensity in increments of 20 units.

The imagewise exposed construction was developed using the aqueous developer solution described in Comparative Example 25. The 80 unit exposure gave the best image as determined by eye using a 10× eye piece. The image displayed 2% and 98% dots and screens and complete 8 positive and negative microlines. The reflective optical density=0.89, transparency=2.44, background ΔE=0.16.

Example 32

A nucleophilic metal-azo magenta dye was introduced into polymerized azlactone to give 6 mole % of a sidechain colorant. The remaining azlactone rings were functionalized to give 12% HEMA, 3% aspartate, and 79% carboxylate. There was 6 mole % of the nucleophilic metal-azo magenta dye in the copolymer The formulation is given below:

| Component (% Solids) | Wt (g) | Wt solids (g) | % Solids |
|---|---|---|---|
| multifunctional oligomer (50%) | 0.939 | 0.470 | 31.7 |
| reactive polymer (7.3%) Example 18 | 12.226 | 0.892 | 60.3 |
| MEK | 5.359 | — | — |
| wetting agent | 0.041 | 0.041 | 2.8 |
| photoinitiator | 0.077 | 0.077 | 5.2 |
| Total | 18.642 | 1.480 | 100.0 |

The wetting agent, photoinitiator and multifunctional oligomer used were those described in Comparative Example 25. This colorant formulation was coated onto polyester (commercially available from ICI Americas, under the trade designation "505") using a #14 Meyer bar, and dried in a convection oven at 200° F. for 2 minutes. The colored construction was exposed to actinic radiation using a Berkey-Ascor 5 kW vacuum frame exposure unit through a set of five UGRA targets with 30-150 units at high intensity in increments of 50 units.

The imagewise exposed construction was developed using the aqueous developer solution described in Comparative Example 25. The 60 unit exposure gave the best image as determined by eye using a 10× eye piece. The image displayed 2% and 98% dots and screens and complete 8 positive and negative microlines. The reflective optical density=1.49, transparency=2.15. background ΔE=1.30.

Example 33

A polymerizable yellow anthraquinone dye was copolymerized with azlactone (as prepared in Example 15). The remaining azlactone rings were functionalized to give 50% HEMA, 10% aspartate, 35% carboxylate and 5% yellow dye. The formulation is given below:

| Component (% Solids) | Wt (g) | Wt solids (g) | % Solids |
|---|---|---|---|
| multifunctional oligomer (50%) | 1.406 | 0.703 | 47.7 |
| reactive polymer (7.3%) Example 15 | 6.181 | 0.451 | 30.6 |
| MEK | 4.215 | — | — |
| wetting agent (43.8%) | 0.404 | 0.177 | 12.0 |
| photoinitiator | 0.143 | 0.143 | 9.7 |
| Total | 12.349 | 1.474 | 100.0 |

The wetting agent, photoinitiator and multifunctional oligomer used were those described in Comparative Example 25. This colorant formulation was coated onto 2 mil PET (commercially available from ICI Americas, under the trade designation "505") using a #10 Meyer bar, and dried in a convection oven at 200° F. for one minute. The colored construction was exposed to actinic radiation using a Berkey-Ascor 5 kW vacuum frame exposure unit through a set of five UGRA targets with 2-10 units at low intensity in increments of 2 units. A piece of commercially available paper base was coated with an acrylic adhesive. The exposed construction was laminated with the adhesive-coated paper base using a hot roll lamination processor operating at 280° F. for the upper roll and 180° F. for the lower roll and a transport speed of 4. The laminated construction was cooled to room temperature and the PET was peeled off to afford a positive image on the paper base and a negative image on the PET. The 6 unit exposure gave the best image as determined by eye using a 10× eye piece. The image displayed 5% and 95% dots and screens and complete 10 positive and negative microlines.

Example 34

A polymerizable metal-azo magenta dye was copolymerized with azlactone (as prepared in Example 21) and was functionalized to give 25% HEMA, 5% aspartate, 68% carboxylate and 2% magenta dye. The formulation is given below:

| Component (% Solids) | Wt (g) | Wt solids (g) | % Solids |
|---|---|---|---|
| multifunctional oligomer (50%) | 1.383 | 0.692 | 27.6 |
| reactive polymer (15%) Example 21 | 9.697 | 1.455 | 57.9 |
| wetting agent (43.8%) | 0.513 | 0.225 | 9.0 |
| photoinitiator | 0.140 | 0.140 | 5.6 |
| Total | 11.733 | 2.512 | 100.1 |

The wetting agent, photoinitiator and multifunctional oligomer used were those described in Comparative Example 25. This colorant formulation was coated onto 2 mil PET (commercially available from ICI Americas, under the trade designation "505") using a #10 Meyer bar, and dried in a convection oven at 200° F. for 2 minutes. The colored construction was exposed to actinic radiation using a Berkey-Ascor 5 kW vacuum frame exposure unit through a set of five UGRA targets with 2-10 units at low intensity in increments of 2 units. This exposed film was laminated to an adhesive coated paper base as described in Example 33. The laminated construction was peeled off the paper base to afford a positive image on the paper base and a negative image on the PET. The 10 unit exposure gave the best image on the paper base as determined by eye using a 10× eye piece. The image displayed 2% and 98% dots and screens and 6 positive and negative microlines.

Example 35

A polymerizable cyan anthraquinone dye was copolymerized with azlactone (as prepared in Example 22) and was functionalized to give 33% HEMA 8% aspartate, 51% carboxylate and 8% cyan dye. The formulation is given below:

| Component (% Solids) | Wt (g) | Wt solids (g) | % Solids |
| --- | --- | --- | --- |
| multifunctional oligomer (50%) | 1.398 | 0.699 | 35.1 |
| reactive polymer (16.6%) Example 22 | 5.319 | 0.883 | 44.3 |
| wetting agent (43.9%) | 0.513 | 0.225 | 11.3 |
| photoinitiator | 0.186 | 0.186 | 9.3 |
| Total | 7.416 | 1.993 | 100.0 |

The wetting agent, photoinitiator and multifunctional oligomer used were those described in Comparative Example 25. This colorant formulation was coated onto 2 mil PET (commercially available from ICI Americas, under the trade designation "505") using a #10 Meyer bar, and dried in a convection oven at 200° F. for 2 minutes. The colored construction was exposed to actinic radiation using a Berkey-Ascor 5 kW vacuum frame exposure unit through a set of five UGRA targets with 2-10 units at low intensity in increments of 2 units. This exposed film was laminated to an adhesive coated paper base as described in Example 33. The laminated construction was peeled off the paper base to afford a positive image on the paper base and a negative image on the PET. The 10 unit exposure gave the best image on the paper base as determined by eye using a 10× eye piece. The image displayed 2% and 98% dots and screens and 6 positive and negative microlines.

Various modifications and alterations of this invention will become apparent to those skilled in the art without departing from the scope and spirit of this invention, and it should be understood that this invention is not to be unduly limited to the illustrative embodiments set forth herein above.

We claim:

1. A reactive copolymeric dye comprising repeating units of azlactone and a free-radically polymerizable dye.

2. The reactive copolymeric dye according to claim 1 wherein the free-radically polymerizable dye has a chromophoric moiety selected from the group consisting of anthraquinone, metal-azo methine, metal-azo, azo, indoaniline, aminostyryl and hydrazone moiety.

3. The reactive copolymeric dye according to claim 2 wherein the azlactone repeating units are functionalized with one or more nucleophilic groups.

4. The reactive copolymeric dye according to claim 3 wherein one of the nucleophilic groups contains a free-radically polymerizable group.

5. The reactive copolymeric dye according to claim 3 wherein one of the nucleophilic groups contains an aqueous solubilizing group.

6. The reactive copolymeric dye according to claim 3 wherein the azlactone repeating units are functionalized with nucleophilic groups containing a free-radically polymerizable group and nucleophilic groups containing an aqueous solubilizing group.

7. A reactive polymeric dye comprising repeating units of azlactone wherein 0.1 to 99.9% by mole of the azlactone repeating units are functionalized with an nucleophilic dye selected from the group consisting of metal-azo, metal-azo methine, anthraquinone, hydrazone, indoaniline, and aminostyryl dyes and the remaining azlactone repeating units are functionalized with one or more nucleophilic groups, such that one or more of the nucleophilic groups contains a free-radically polymerizable group, an aqueous solubilizing group or combination thereof.

8. A reactive polymeric dye comprising a formula:

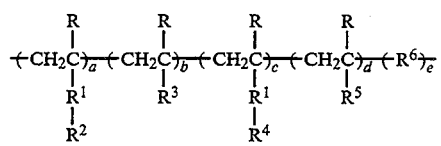

wherein
R is hydrogen or an alkyl group containing 1 to 18 carbon atoms;
$R^1$ is:

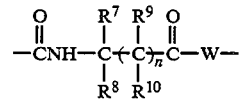

n is 0 or 1;
$R^7$, $R^8$, $R^9$, and $R^{10}$ is independently an alkyl group having 1 to 12 carbon atoms, a cycloalkyl group having 5 to 12 carbon atoms, an aryl or aralkyl group having 6 to 12 carbon atoms or at least one of the pairs $R^7$ and $R^8$, or $R^9$ and $R^{10}$, taken together with the carbon to which it is joined forms a 5- or 6-membered carbocyclic ring, or any of $R^7$, $R^8$, $R^9$ and $R^{10}$ is H when n is 1;
W is —$NR^{14}$—, —S— or —O—, wherein $R^{14}$ is a hydrogen, aryl or alkyl of 1 to 12 carbon atoms;
$R^2$ is a polymerizable, ethylenically unsaturated group selected from (a) —$R^{11}$—W—T in which $R^{11}$ is be an alkylene group having 1 to 12 carbon atoms, an arylene group having 6 to 10 carbon atoms, an oxyalkylene group or a poly(oxyalkylene) in which the alkylene group has 2 to 6 carbon atoms and the number of oxygen atoms is a positive integer less than or equal to four; W is as previously defined, and T is an ethylenically unsaturated group selected from the group consisting of acryloyl, methacryloyl, cinnamoyl, maleoyl, fumaroyl, itaconoyl, and crotonoyl;

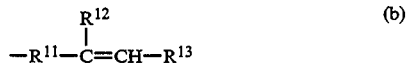

in which $R^{11}$ is as defined as in (a); $R^{12}$ and $R_{13}$ independently are hydrogen, cyano, a carboxyl group, a —C(=O)$NH_2$ group, an alkyl group having 1 to 12 carbon atoms, or a phenyl group or naphthyl group optionally having substitution thereon which is a halogen, an alkyl or alkoxy group from 1 to 4 carbon atoms;
$R^3$ is:

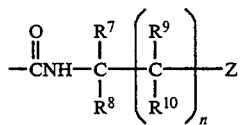

wherein n is 0 or 1; $R^7$, $R^8$, $R^9$ and $R^{10}$ are as described above, and Z is a carboxy, or aminocarbonyl, where the carboxy group has the formula $COOW^1$, and the aminocarbonyl group has the formula $CONR^{14}W^1$;

$W^1$ is a solubilizing cation ionically bonded to a negatively charged $O^-$ or $S^-$, a hydrogen atom or $(Q^1)_x-(A)_y$ wherein x is 1 or 2 and y is 1 to 10; $Q^1$ is a polyvalent linking group, wherein the linking group contains polyvalent aliphatic moieties, polyvalent aromatic moieties, polyvalent aralkyl moieties, or polyvalent alkaryl moieties, a carbonyl group, a sulfonyl group, either alone or in combination; further $Q_1$ is linear or branched and optionally contains other polyvalent moieties, wherein such polyvalent moieties are oxy, thio, —$NHSO_2$—, —NHCO— or —NH— and are interspersed between polyvalent aromatic or polyvalent aliphatic groups, or $Q^1$ is capable of bonding to more than one A group;

$R^4$ is $(Q^2)_i-(D)_j$ wherein D is a dye moiety or a metal-containing dye fragment, i is 1 or 2 and j is 1 to 10 depending on the value of i and the multifunctional nature of $Q^2$ and $Q^2$ is a polyvalent linking group wherein an atom in $Q^2$, which is covalently bonded to W is a carbon atom, or a sulfur atom provided W is a nitrogen and the sulfur atom is part of a sulfinyl or sulfonyl group; $Q^2$ is linear or branched and optionally contains other polyvalent moieties, wherein side polyvalent moieties are oxy, thio, —$NHSO_2$—, —NHCO—, or —NH— and are either interspersed between polyvalent aromatic or polyvalent aliphatic groups or terminating in these groups; furthermore $Q^2$ optionally contains an auxochromic ligand moiety having a nitrogen-containing heterocyclic moiety; or $Q^2$ can contain a linking group as defined for $Q^1$, which terminates in an auxochromic ligand moiety; or further, $Q^2$ optionally contains up to 50 atoms including carbon, nitrogen, sulfur, and non-peroxidic oxygen atoms; or $Q^2$ is coordinated to a metal containing dye fragment or covalently bonded to a metallized dye moiety; $Q^2$ is bonded to a chromophoric moiety either directly or through an auxochromic group and when the metal center of a metallized or metal-containing dye is chromium, cobalt or iron, an ancillary ligand is present; and D are radicals derived from an aminostyryl, anthraquinone, 1,4-diamino-2,3 dicarboximideanthraquinone, hydrazone, metal-azo, metal-azo methine, indoaniline, metal formazan, phthalocyanine, naphthaquinone, or nitro dye;

$R^5$ is $(Q^2)_p(D)_q$, wherein $Q^2$ and D are defined as above and D may further include azo dyes, p is 0 to 1 and q is 1 to 10, the atom bonded to the polymeric chain is a carbon, nitrogen, sulfur, or oxygen atom and $Q^2$ is attached to a metal-containing dye either by coordination to the metal of a metal-containing dye fragment or by formation of a covalent bond to a metallized dye moiety;

a, b, c, d and e independently represent a ratio of a monomeric unit to the total number of monomeric units of the functionalized portion of the azlactone moities, such that the sum of a+b+c+d+e equals 1, a is 0.10–0.99, b is 0.0–0.89, c is 0.0–0.99, d is 0–0.99, and e is 0–0.99, with the proviso that the sum of c+d is at least 0.01; and $R^6$ is a unit of the polymer derived from free radically polymerizable monomers.

9. The reactive polymeric dye according to claim 8 wherein a is 0.5–0.6, b is 0.1–0.5 and c is 0.01–0.5 with the proviso the sum of a+b+c equals 1.

10. The reactive polymeric dye according to claim 8 wherein a is 0.5–0.6, b is 0.1–0.5 and d is 0.01–0.2 with the proviso the sum of a+b+d equals 1.

11. The reactive polymeric dye according to claim 8 wherein a is 0.5–0.6, b is 0.1–0.5, c is 0.01–0.5 and d is 0.01–0.2 with the proviso the sum of a+b+c+d equals 1.

12. The reactive polymeric dye according to claim 8 wherein a is 0.5–0.6, b is 0.1–0.5, c is 0.01–0.5 and e is up to 0.2 with the proviso the sum of a+b+c+e equals 1.

13. The reactive polymeric dye according to claim 8 wherein a is 0.5–0.6, b is 0.1–0.5, d is 0.01–0.5 and e is up to 0.2 with the proviso the sum of a+b+d+e equals 1.

14. A colorant layer formulation comprising a reactive polymeric dye according to claim 8.

15. A color proofing construction comprising (a) flexible support base film and (b) a colorant layer comprising a reactive polymeric dye according to claim 8.

16. The reactive polymeric dye of claim 8 wherein $R^4$ is —$Q^2D$ and $Q^2$ is a polyvalent aliphatic group, a polyvalent alkaryl group or a polyvalent aromatic group, wherein the groups each contain 1 to 50 atoms including carbon, nitrogen, sulfur, and non-peroxidic oxygen atoms; and D is a dye moiety or metal-containing dye fragment derived from an aminostyryl, anthraquinone, substituted anthraquinone, substituted azo, hydrazone, metal-azo, metal-azo methine, indoaniline, metal formazan, phthalocyanine, naphthaquinone, substituted naphthaquinone, nitro or dye.

17. The reactive polymeric dye of claim 16 wherein D is a dye moiety or metal-containing dye fragment derived from an anthraquinone dye.

18. The reactive polymeric dye of claim 16 wherein $Q^2$ is attached to D through O, S, NH, NR, NHCO, $NHSO_2$, CONH, COO, OC(O) or $SO_2NH_2$.

19. The reactive polymeric dye of claim 18 wherein D is a radical derived from an aminostyryl dye.

20. The reactive polymeric dye of claim 18 wherein D is a radical derived from a phthalocyanine dye.

21. The reactive polymeric dye of claim 8 wherein $R^4$ is —$Q^2D$ and $Q^2$ is at least one of a linear or branched polyvalent aliphatic group containing up to 20 carbons and, optionally, containing O, S, N, COO, CONH and terminated with a radical of a nitrogen-containing hetereocycle, such that at least one lone pair of electrons are available for ligating to a metal in D; D is an organic-derived radical or a metal-containing dye fragment of a metal-azo or metal-azo methine dye, wherein the metal-azo or metal-azo methine ligand is at least bidentate and the metal is chromium, cobalt, iron, nickel, palladium, platinum, or copper, such that when the metal is chromium, cobalt or iron, an ancillary ligand or ligands are present to satisfy the coordination of the metal.

22. The reactive polymeric dye of claim 21 wherein the metal is chromium or cobalt and the ancillary ligand is a bidentate monoanionic ligand.

23. The reactive polymeric dye of claim 22 wherein the bidentate monoanionic ligand is either an alkyl-diketonate(−1) or a 8-hydroxyquinolate (−1) ligand.

24. The reactive polymeric dye of claim 22 wherein the bidentate monoanionic ligand is an acetylacetonate (−1) ligand.

25. The reactive polymeric dye of claim 8 wherein $R^4$ is $Q^2D$ and $Q^2$ is at least one of a linear or branched polyvalent aliphatic group containing up to 20 carbons and terminated with one of 2-pyridyl, 3-pyridyl, 4-pyridyl, or 1-imidazolyl; D is an organic-derived radical or a metal-containing dye fragment of a metal-azo or metal-azo methine dye, wherein the metal-azo or metal-azo methine ligand is at least a bidentate ligand; such that when the metal is chromium or cobalt a bidentate monoanionic ancillary ligand is present to satisfy the coordination of the metal.

26. The reactive polymeric dye according to claim 25 having the formula:

27. The reactive polymeric dye of claim 8 wherein $R^5$ is —$Q^2D$ and $Q^2$ is at least one of a linear or branched polyvalent aliphatic group containing up to 20 carbons optionally, containing O, S, N, COO, CONH, and terminated with a radical of a nitrogen-containing heterocycle, wherein one lone pair of electrons is available for ligating to the metal, D is an organic-derived radical or a metal, containing dye fragment of a metal-azo or metal-azo methine dye, wherein the metal-azo or metal-azo methine ligand is at least a bidentate ligand, and the metal is chromium or cobalt.

28. The reactive polymeric dye of claim 8 wherein $R^5$ is —$Q^2D$ and $Q^2$ is 2-pyridyl, 3-pyridyl, 4-pyridyl or 1-imidazolyl; D is an organic-derived radical or a metal-containing dye fragment of a metal-azo or metal-azo methine dye wherein the metal-azo or metal-azo methine ligand is at least bidentate; and the metal is chromium, cobalt, iron, nickel, palladium, platinum or copper, such that when the metal is chromium, cobalt, or iron, an ancillary ligand or ligands are present to satisfy the coordination of the metal.

29. The reactive polymeric dye according to claim 28 having the formula:

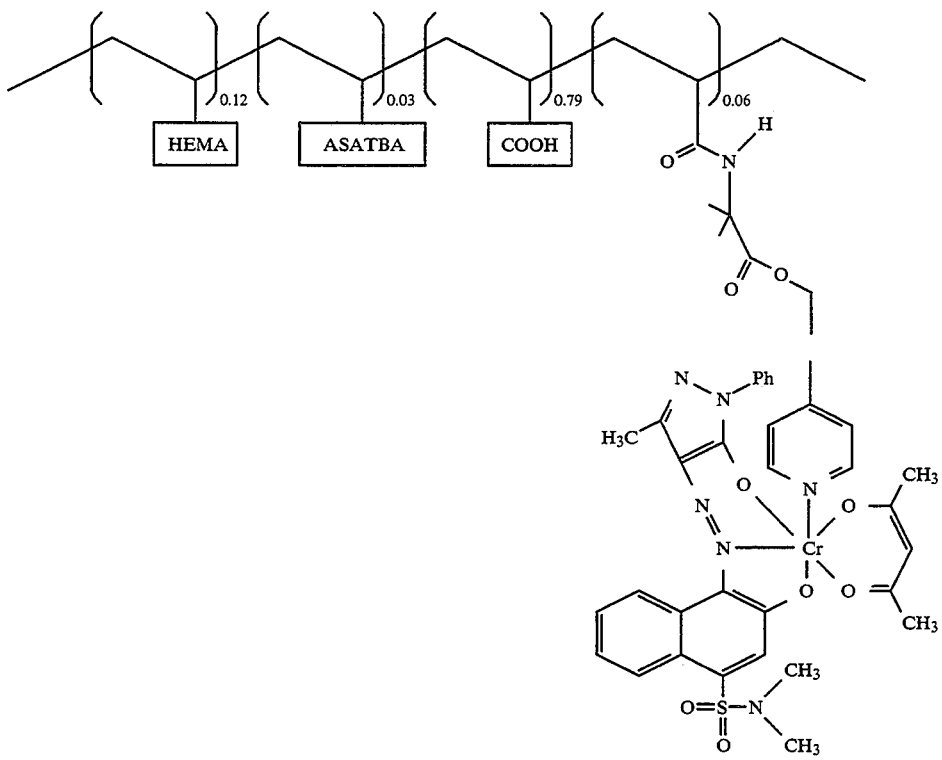

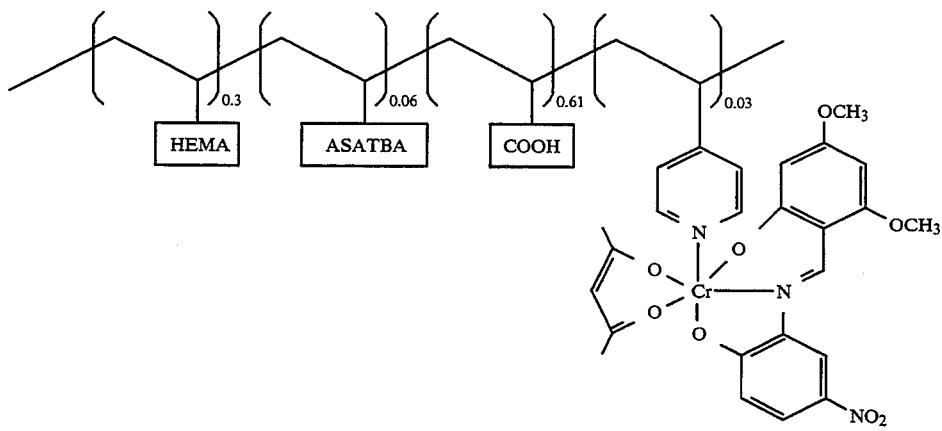

30. The reactive polymeric dye according to claim 28 having the formula:

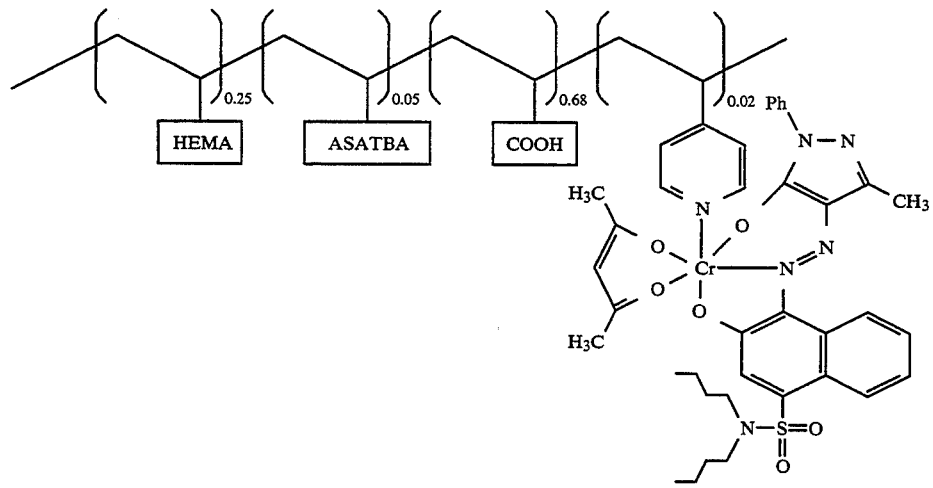

31. The reactive polymeric dye of claim 8 wherein $R^5$ is $-Q^2D$ and $Q^2$ is at least one of a linear or branched polyvalent aliphatic group containing 1 to 10 carbon atoms, optionally, containing nitrogen, sulfur and non-peroxidic oxygen and attached to D through O, S, NH, NR, NHCO, CONH, NHSO$_2$, or SO$_2$NH$_2$; D is a dye moiety derived from an aminostyryl, anthraquinone, substituted anthraquinone, azo, substituted azo, hydrazone, metal-azo, metal-azo methine, indoaniline, metal formazan, phthalocyanine, naphthaquinone, substituted naphthaquinone, or nitro dye.

32. The reactive polymeric dye of claim 8 wherein $R^5$ is $-Q^2D$ and $Q^2$ is O, S, SO$_2$, CO, NH, NR, NHCO, CONH, NHSO$_2$, SO$_2$NH$_2$, or COO; and D is a dye moiety derived from an aminostyryl, anthraquinone, substituted anthraquinone azo, substituted azo, hydrazone, metal,-azo, metal-azo methine, indoaniline, metal formazan, phthalocyanine, naphthaquinone, substituted naphthaquinone or nitre dye.

33. The reactive polymeric dye according to claim 32 having the formula:

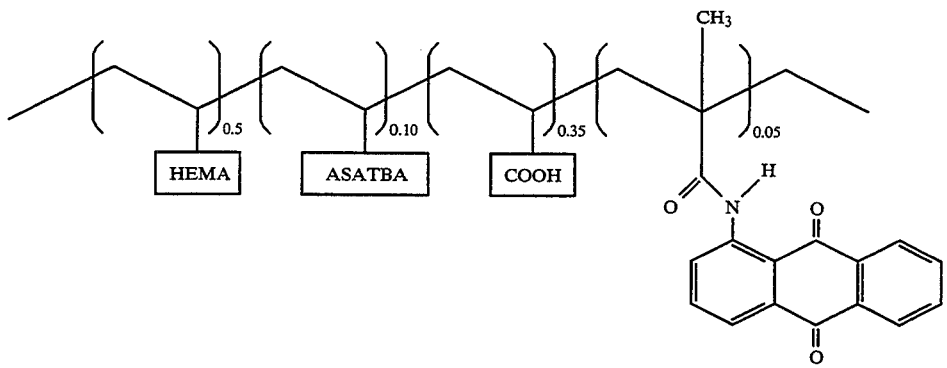

34. The reactive polymeric dye of claim 8 wherein $R^5$ is —$Q^2$—D and $Q^2$ is $C_6H_4NH$; and D is a dye moiety derived from an aminostyryl, anthraquinone, substituted anthraquinone azo, substituted azo, hydrazone, metal-azo, metal-azo methine, indoaniline, metal formazan, phthalocyanine, naphthaquinone, substituted naphthaquinone or nitre dye.

35. The reactive polymeric dye of claim 34 wherein D is a dye moiety derived from an anthraquinone dye.

36. The reactive polymeric dye according to claim 35 having the formula:

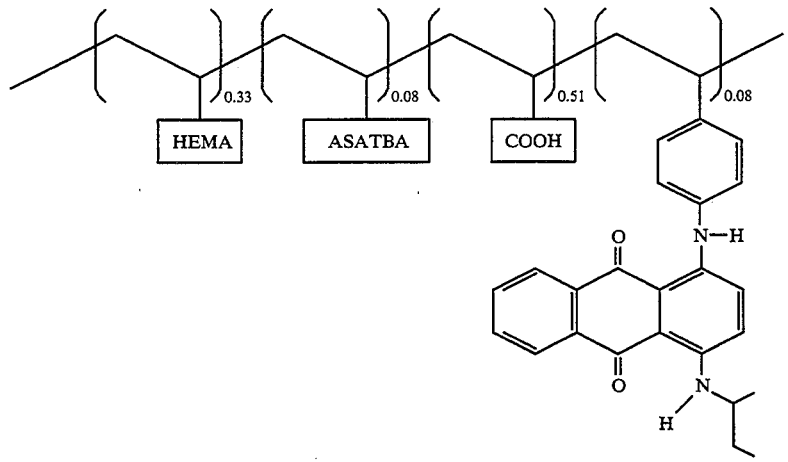

37. A photoresist system comprising the reactive polymeric dye according to claim 8.

* * * * *

UNITED STATES PATENT AND TRADEMARK OFFICE
CERTIFICATE OF CORRECTION

PATENT NO. : 5,362,812
DATED : November 8, 1994
INVENTOR(S) : Holmes et al.

It is certified that error appears in the above-indentified patent and that said Letters Patent is hereby corrected as shown below:

Col. 8, line 2, Replace "$NP_2$" with --$NR_2$--

Col. 13, line 22 & 23, Insert --to-- between "up" and "0.2"

Col. 38, line 49, Replace "A" with --Δ--

Col. 45, line 44, Replace "can contain" with --optionally contains--

Signed and Sealed this

Third Day of October, 1995

Attest:

BRUCE LEHMAN

Attesting Officer     Commissioner of Patents and Trademarks